United States Patent
Sekiguchi et al.

(10) Patent No.: US 10,734,255 B2
(45) Date of Patent: Aug. 4, 2020

(54) SUBSTRATE CLEANING METHOD, SUBSTRATE CLEANING SYSTEM AND MEMORY MEDIUM

(71) Applicant: TOKYO ELECTRON LIMITED, Minato-ku (JP)

(72) Inventors: Kenji Sekiguchi, Koshi (JP); Itaru Kanno, Minato-ku (JP); Meitoku Aibara, Koshi (JP); Kouzou Tachibana, Koshi (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 292 days.

(21) Appl. No.: 15/599,067

(22) Filed: May 18, 2017

(65) Prior Publication Data

US 2017/0345685 A1 Nov. 30, 2017

(30) Foreign Application Priority Data

May 25, 2016 (JP) .................................. 2016-104264
Mar. 30, 2017 (JP) .................................. 2017-066950

(51) Int. Cl.
*H01L 21/67* (2006.01)
*H01L 21/02* (2006.01)
*B08B 7/00* (2006.01)
*B08B 3/04* (2006.01)

(52) U.S. Cl.
CPC .......... *H01L 21/67051* (2013.01); *B08B 3/04* (2013.01); *B08B 7/0014* (2013.01); *H01L 21/02052* (2013.01); *H01L 21/67028* (2013.01)

(58) Field of Classification Search
CPC ... B08B 7/0014; B08B 3/04; H01L 21/67051; H01L 21/02052; H01L 21/67028
See application file for complete search history.

(56) References Cited

U.S. PATENT DOCUMENTS

| 6,348,096 | B1 * | 2/2002 | Sunakawa ............... C30B 25/02 117/88 |
| 2009/0011369 | A1 * | 1/2009 | Wong ...................... G03F 7/091 430/322 |
| 2014/0041685 | A1 | 2/2014 | Kaneko et al. |
| 2014/0144464 | A1 | 5/2014 | Kaneko et al. |

(Continued)

FOREIGN PATENT DOCUMENTS

JP 2015-119164 A 6/2015

*Primary Examiner* — Mikhail Kornakov
*Assistant Examiner* — Natasha N Campbell
(74) *Attorney, Agent, or Firm* — Oblon, McClelland, Maier & Neustadt, L.L.P.

(57) ABSTRACT

A substrate cleaning method includes supplying, onto a substrate, a film-forming processing liquid including a volatile component and a polar organic material that forms a processing film on the substrate, volatilizing the volatile component such that the film-forming processing liquid solidifies or cures and forms the processing film on the substrate, supplying, to the processing film formed on the substrate, a peeling processing liquid that peels off the processing film from the substrate and includes a non-polar solvent, and supplying, to the processing film, a dissolution processing liquid that dissolves the processing film and includes a polar solvent after the supplying of the peeling processing liquid. The non-polar solvent does not contain water, and the polar solvent does not contain water.

20 Claims, 14 Drawing Sheets

(56) References Cited

U.S. PATENT DOCUMENTS

| | | |
|---|---|---|
| 2014/0144465 A1 | 5/2014 | Kaneko et al. |
| 2015/0064910 A1 | 3/2015 | Kaneko et al. |
| 2015/0064911 A1 | 3/2015 | Kaneko et al. |
| 2015/0128994 A1 | 5/2015 | Kaneko et al. |
| 2015/0128995 A1 | 5/2015 | Kaneko et al. |
| 2015/0353793 A1* | 12/2015 | Yasuda ............... C09J 153/025 438/759 |
| 2016/0035561 A1 | 2/2016 | Aibara et al. |
| 2016/0035564 A1 | 2/2016 | Aibara et al. |

* cited by examiner

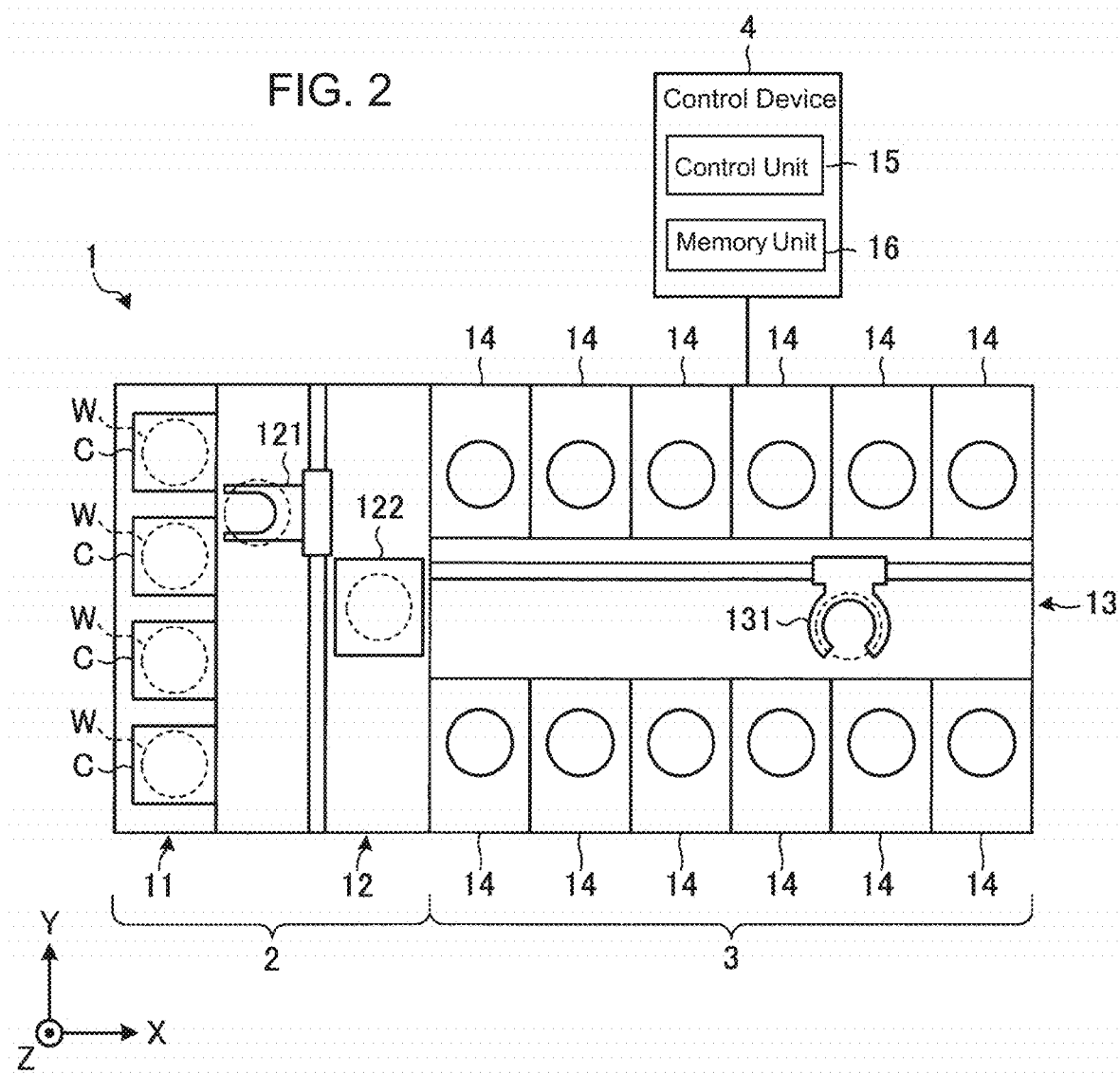

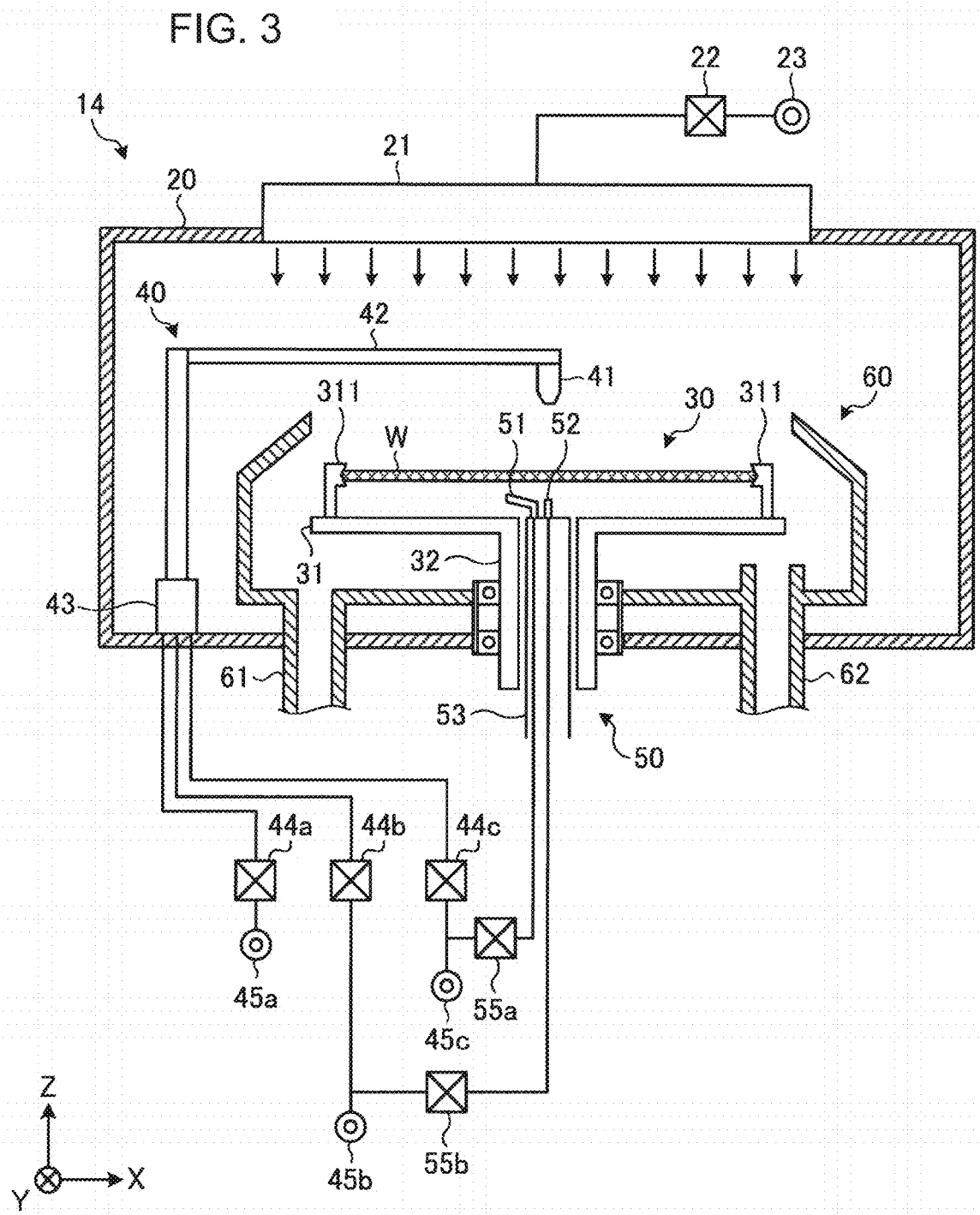

SUBSTRATE CLEANING METHOD, SUBSTRATE CLEANING SYSTEM AND MEMORY MEDIUM

CROSS-REFERENCE TO RELATED APPLICATIONS

The present application is based upon and claims the benefit of priority to Japanese Patent Applications No. 2016-104264, filed May 25, 2016, and No. 2017-066950, filed Mar. 30, 2017. The entire contents of these applications are incorporated herein by reference.

BACKGROUND OF THE INVENTION

Field of the Invention

The present invention relates to a substrate cleaning method, a substrate cleaning system and a memory medium.

Description of Background Art

There is a substrate cleaning apparatus that removes particles attached to a substrate such as silicon wafer or a compound semiconductor wafer. For example, Japanese Patent Laid-Open Publication No. 2015-119164 describes a substrate cleaning method. The entire contents of this publication are incorporated herein by reference.

SUMMARY OF THE INVENTION

According to one aspect of the present invention, a substrate cleaning method includes supplying, onto a substrate, a film-forming processing liquid including a volatile component and a polar organic material that forms a processing film on the substrate, volatilizing the volatile component such that the film-forming processing liquid solidifies or cures and forms the processing film on the substrate, supplying, to the processing film formed on the substrate, a peeling processing liquid that peels off the processing film from the substrate and includes a non-polar solvent, and supplying, to the processing film, a dissolution processing liquid that dissolves the processing film and includes a polar solvent after the supplying of the peeling processing liquid. The non-polar solvent does not contain water, and the polar solvent does not contain water.

According to another aspect of the present invention, a substrate cleaning system includes a processing liquid supply device that supplies a film-forming processing liquid, a peeling processing liquid and a dissolution processing liquid onto a substrate, and a control device including circuitry that controls the processing liquid supply device. The circuitry of the control device controls the processing liquid supply device such that the film-forming processing liquid including a volatile component and a polar organic material that forms a processing film on the substrate is supplied onto the substrate, the volatile component is volatilized to solidify or cure the film-forming processing liquid and to form the processing film on the substrate, the peeling processing liquid that peels off the processing film from the substrate and includes a non-polar solvent that does not contain water is supplied to the processing film formed on the substrate, and the dissolution processing liquid that dissolves the processing film and includes a polar solvent that does not contain water is supplied to the processing film after the supplying of the peeling processing liquid.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 is a schematic diagram illustrating a structure of a substrate cleaning system according to the first embodiment;

FIG. 3 is a schematic diagram illustrating a structure of a substrate cleaning apparatus according to the first embodiment;

DETAILED DESCRIPTION OF THE EMBODIMENTS

Figure 1A:
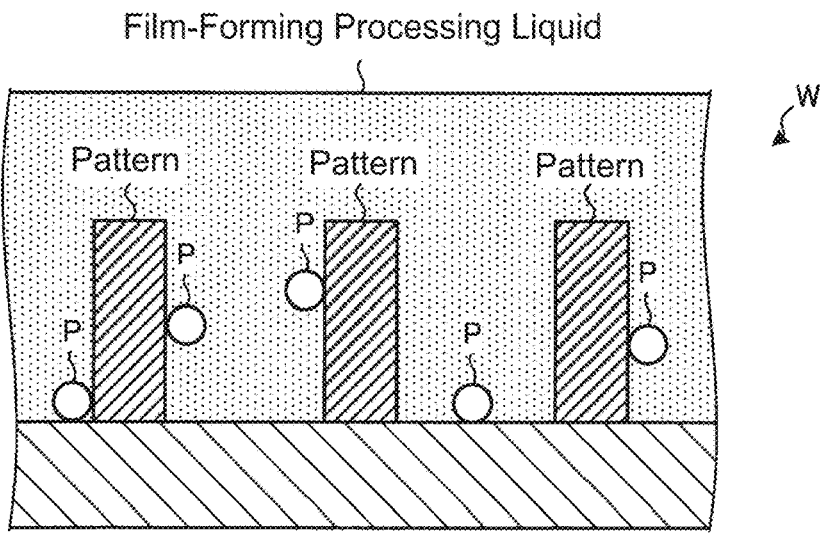
FIG. 1A is an explanatory diagram of a substrate cleaning method according to a first embodiment.

The embodiments will now be described with reference to the accompanying drawings, wherein like reference numerals designate corresponding or identical elements throughout the various drawings.

First Embodiment

Content of Substrate Cleaning Method

Content of a substrate cleaning method according to an embodiment of the present invention is described using FIG. 1A-1E. FIG. 1A-1E are explanatory diagrams of the substrate cleaning method according to the present embodiment.

As illustrated in FIG. 1A, in the substrate cleaning method according to the present embodiment, a processing liquid (hereinafter, referred to as a "film-forming processing liquid") that contains a volatile component and is for forming a film on a substrate (hereinafter, referred to as a "wafer (W)") such as a silicon wafer or a compound semiconductor wafer is supplied to a pattern forming surface of the wafer (W).

The film-forming processing liquid supplied to the pattern forming surface of the wafer (W) solidifies or cures to form a processing film while volume shrinkage due to volatilization of the volatile component occurs. As a result, patterns formed on the wafer (W) and particles (P) attached to the patterns are covered by the processing film (see FIG. 1B). There, the term "solidifying" means solidification, and the term "curing" means that molecules are coupled to each other to polymerize (such as cross-linking and polymerization).

Figure 1B:
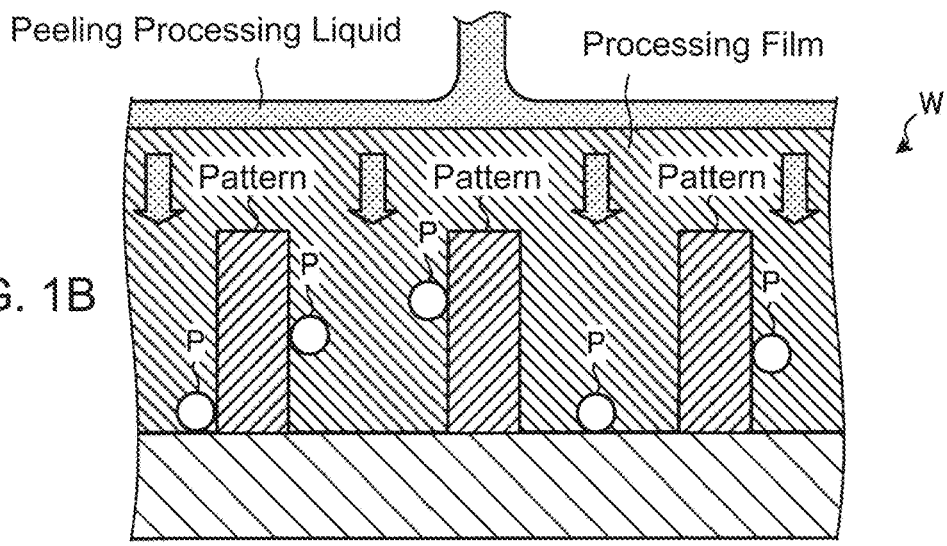
FIG. 1B is an explanatory diagram of the substrate cleaning method according to the first embodiment.

As illustrated in FIG. 1B, a peeling processing liquid is supplied to the processing film on the wafer (W). The peeling processing liquid is a processing liquid for peeling the processing film from the wafer (W).

Specifically, after being supplied to the processing film, the peeling processing liquid penetrates into the processing film and reaches an interface of the wafer (W). The peeling processing liquid that reached the interface of the wafer (W) penetrates to the pattern forming surface, which is the interface of the wafer (W).

Figure 1C:
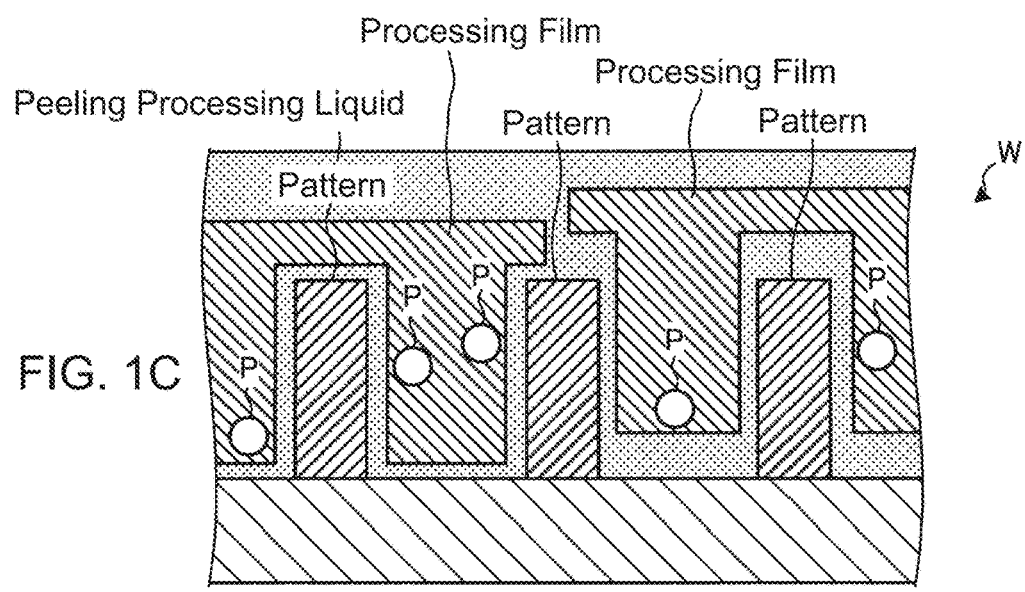
FIG. 1C is an explanatory diagram of the substrate cleaning method according to the first embodiment.

In this way, the peeling processing liquid penetrates into between the wafer (W) and the processing film, and thereby, the processed film, in a state of a "film," peels off from the wafer (W). Along with this, the particles (P) attached to the pattern forming surface are peeled from the wafer (W) together with the processing film (FIG. 1C).

The particles (P) attached to the patterns and the like can be separated from the patterns and the like by a strain (tension force) caused by the volume shrinkage of the film-forming processing liquid due to volatilization of the volatile component.

Figure 1D:
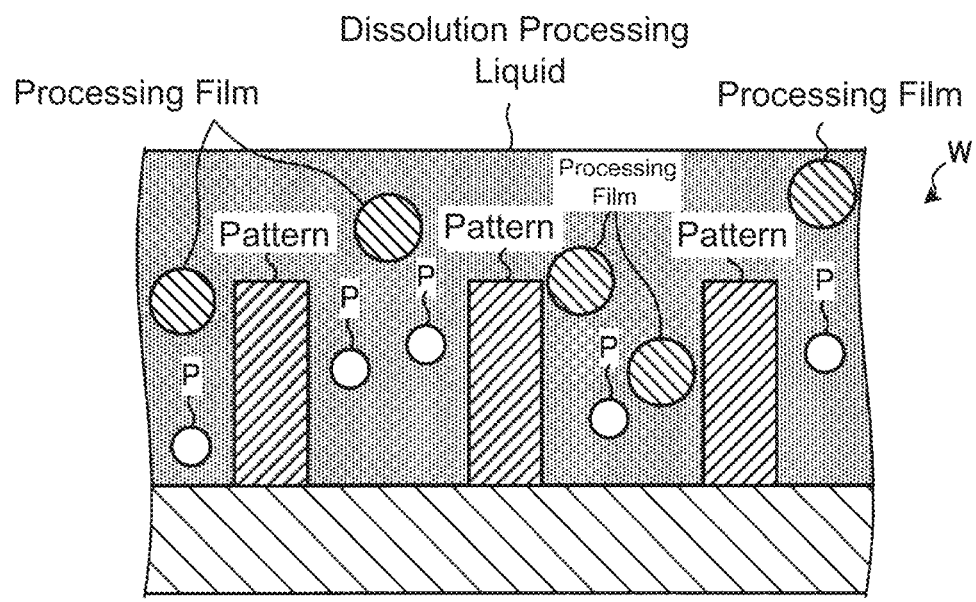
FIG. 1D is an explanatory diagram of the substrate cleaning method according to the first embodiment.
Figure 1E:
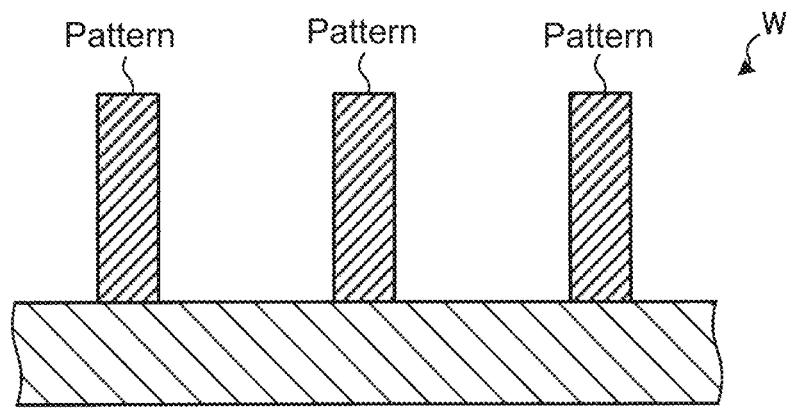
FIG. 1E is an explanatory diagram of the substrate cleaning method according to the first embodiment.

Subsequently, a dissolution processing liquid that dissolves the processing film is supplied to the processing film peeled from the wafer (W). As a result, the processing film dissolves, and the particles (P) that have been incorporated into the processing film are in a state of being suspended in the dissolution processing liquid (FIG. 1D). Thereafter, by washing away the dissolution processing liquid and the dissolved processing film using pure water or the like, the particles (P) are removed from the wafer (W) (FIG. 1E).

In the substrate cleaning method according to the present embodiment, by peeling the processing film formed on the wafer (W) from the wafer (W) in a state of a "film," the particles (P) attached to the patterns and the like are removed from the wafer (W) together with the processing film.

According to the substrate cleaning method of the present embodiment, the particles are removed without using a chemical action. Therefore, erosion of a base film due to an etching action or the like can be suppressed.

Further, according to the substrate cleaning method of the present embodiment, the particles (P) can be removed with a weaker force as compared to a conventional substrate cleaning method in which a physical force is used. Therefore, pattern collapse can be suppressed.

Further, according to the substrate cleaning method of the present embodiment, the particles (P) having small particle sizes that are difficult to remove using a conventional substrate cleaning method in which a physical force is used can be easily removed.

In the substrate cleaning method according to the present embodiment, after being formed on the wafer (W), the processing film is completely removed from the wafer (W) without performing pattern exposure. Therefore, the wafer (W) after the cleaning is in a state before the film-forming processing liquid is applied, that is, in a state in which the pattern forming surface is exposed.

In the present embodiment, a top coating liquid is used as the film-forming processing liquid. A top coating film formed by solidification or curing of the top coating liquid is a protective film applied to an upper surface of a resist in order to prevent penetration of an immersion liquid into the resist.

The immersion liquid is, for example, a liquid used for liquid immersion exposure in a lithography process. The top coating liquid contains an acrylic resin having a volume shrinking property when solidifying or curing.

Since the volume shrinkage is caused by not only the volatilization of the volatile component by also the cure shrinkage of the acrylic resin, the top coating liquid has a larger volume shrinkage rate as compared to film-forming processing liquid containing only a volatile component, and can strongly pull apart the particles (P) from the wafer (W).

In particular, since the acrylic resin has a larger volume shrinkage rate than other resins such as an epoxy resin, the top coating liquid is effective in applying a tensile force to the particles (P). Further, it is not necessary to use a top coating liquid that is used in a lithography process. In order to improve a tension force due to volume shrinkage or to improve performance of peeling from a substrate, a liquid obtained by adding other chemical liquids to a top coating liquid that is used in a lithography process may be used.

In Japanese Patent Laid-Open Publication No. 2015-119164, DIW is used as a peeling processing liquid, and an alkaline aqueous solution is used as a dissolution processing liquid. However, depending on a material that forms the surface of the wafer (W), a processing liquid containing water cannot be used. Examples of such materials include Ge, III-V groups, and the like. Materials of this type react with water and dissolve. Further, there are also metal materials of magnetoresistive memories such as MRAM, PCRAM, and ReRAM. Materials of this type also react with water and corrode.

In the present embodiment, instead of a solvent containing water, an organic solvent is used that does not contain water and does not cause a reaction such as dissolution or corrosion with respect to a wafer (W) formed of the above-described materials. Further, since the top coating film on the wafer (W) is formed of an acrylic resin, which is a polar organic material, the peeling processing liquid uses a non-polar solvent that does not dissolve the top coating film, and the dissolution processing liquid uses a polar solvent that dissolves the top coating film.

A polar material is easy to dissolve a polar material, a non-polar material is easy to dissolve a non-polar material, and a polar material and a non-polar material are difficult to dissolve each other. Further, a processing liquid of a non-polar material has good wettability irrespective of a surface state and thus can aggregate at an interface between the surface of the wafer (W) and an film and peel off the film even when the surface of the wafer (W) is hydrophobic.

Specifically, as the peeling processing liquid, for example, at least one of fluorine-based solvents such as HFE (hydrofluoroether), HFC (hydrofluorocarbon), HFO (hydrofluoroolefin), and PFC (perfluorocarbon), which are non-polar solvents, can be used.

As the dissolution processing liquid, for example, at least one of solvents such as alcohols (for example, IPA), PGME (propylene glycol monomethyl ether), PGMEA (propylene glycol monomethyl ether acetate), and MIBC (4-methyl-2-pentanol), which are polar solvents, can be used.

By using the peeling processing liquid and the dissolution processing liquid composed of these exemplified solvents, a cleaning process can be performed without affecting the surface of the wafer (W) such as causing dissolution or corrosion.

Structure of Substrate Cleaning System

Next, a structure of a substrate cleaning system according to the present embodiment is described using FIG. 2. FIG. 2 is a schematic diagram illustrating the structure of the substrate cleaning system according to the present embodiment. In the following description, in order to clarify positional relationship, an X axis, a Y axis and a Z axis that are orthogonal to each other are defined, and the Z axis positive direction is defined as a vertical upward direction.

As illustrated FIG. 2, the substrate cleaning system 1 includes a loading and unloading station 2 and a processing station 3. The loading and unloading station 2 and the processing station 3 are provided adjacent to each other.

The loading and unloading station 2 includes a carrier mounting part 11 and a carrying part 12. Multiple carrying containers (hereinafter, referred to as "carriers (C)") capable of accommodating multiple wafers (W) in a horizontal state are placed in the carrier mounting part 11.

The carrying part 12 is provided adjacent to the carrier mounting part 11. A substrate carrying device 121 and a delivery part 122 are provided inside the carrying part 12.

The substrate carrying device 121 includes a wafer holding mechanism that holds a wafer (W). Further, the substrate carrying device 121 is capable of moving in a horizontal direction and a vertical direction and rotating about a vertical axis, and carries a wafer (W) between a carrier (C) and the delivery part 122 using the wafer holding mechanism.

The processing station 3 is provided adjacent to the carrying part 12. The processing station 3 includes a carrying part 13 and multiple substrate cleaning apparatuses 14. The multiple substrate cleaning apparatuses 14 are provided side by side on both sides of the carrying part 13.

The carrying part 13 includes therein a substrate carrying device 131. The substrate carrying device 131 includes a wafer holding mechanism that holds a wafer (W). Further, the substrate carrying device 131 is capable of moving in a horizontal direction and a vertical direction and rotating about a vertical axis, and carries a wafer (W) between the delivery part 122 and the substrate cleaning apparatuses 14 using the wafer holding mechanism.

The substrate cleaning apparatuses 14 are each an apparatus that performs a substrate cleaning process based on the above-described substrate cleaning method. A specific structure of each of the substrate cleaning apparatuses 14 will be described later.

The substrate cleaning system 1 has a control device 4. The control device 4 is a device that controls operation of the substrate cleaning system 1. The control device 4 is, for example, a computer, and includes a controller 15 and a memory 16. The memory 16 stores a program that controls various processes such as a substrate cleaning process. The controller 15 controls the operation of the substrate cleaning system 1 by reading out and executing the program stored in the memory 16.

The program may be recorded in a computer readable memory medium and may be installed from the memory medium to the memory 16 of the control device 4. Examples of computer readable memory medium include a hard disk (HD), a flexible disk (FD), a compact disc (CD), a magnetic optical disc (MO), a memory card, and the like.

In the substrate cleaning system 1 structured as described above, first, the substrate carrying device 121 of the loading and unloading station 2 takes out a wafer (W) from a carrier (C) and places the taken out wafer (W) on the delivery part 122. The wafer (W) placed on the delivery part 122 is taken out from the delivery part 122 by the substrate carrying device 131 of the processing station 3 and is carried to a substrate cleaning apparatus 14, and a substrate cleaning process is performed by the substrate cleaning apparatus 14. The wafer (W) after cleaning is carried out from the substrate cleaning apparatus 14 by the substrate carrying device 131, and is placed on the delivery part 122, and thereafter, is returned to the carrier (C) by the substrate carrying device 121.

Structure of Substrate Cleaning Apparatus

A structure of a substrate cleaning apparatus 14 is described with reference to FIG. 3. FIG. 3 is a schematic diagram illustrating a structure of a substrate cleaning system 14 according to the present embodiment.

As illustrated in FIG. 3, the substrate cleaning apparatus 14 includes a chamber 20, a substrate holding mechanism 30, a first liquid supply part 40, a second liquid supply part 50, and a collection cup 60.

The chamber 20 accommodates the substrate holding mechanism 30, the first liquid supply part 40, the second liquid supply part 50, and the collection cup 60. An FFU (Fan Filter Unit) 21 is provided in a ceiling part of the chamber 20. The FFU 21 forms a down flow in the chamber 20.

The FFU 21 is connected to a down flow gas supply source 23 via a valve 22. The FFU 21 discharges a down flow gas (for example, dry air) supplied from the down flow gas supply source 23 into the chamber 20.

The substrate holding mechanism 30 includes a rotation holding part 31, a support part 32, and a drive part (not illustrated in the drawings). The rotation holding part 31 is provided substantially at a center of the chamber 20. A holding member 311 that holds the wafer (W) from a lateral side is provided on an upper surface of the rotation holding part 31. The wafer (W) is horizontally held by the holding member 311 in a state of being slightly separated from the upper surface of the rotation holding part 31.

The support part 32 is a member extending in the vertical direction. A base end of the support part 32 is rotatably supported by the drive part. A front end of the support part 32 horizontally supports the rotation holding part 31.

Such a substrate holding mechanism 30 rotates the rotation holding part 31 supported by the support part 32 by rotating the support part 32, and thereby, rotates the wafer (W) held by the rotation holding part 31.

The first liquid supply part 40 supplies various processing liquids to an upper surface of the wafer (W) held by the substrate holding mechanism 30. Such a first liquid supply part 40 includes a nozzle 41, an arm 42 that horizontally supports the nozzle 41, and a tuning and lifting mechanism that turns the arm 42 and raises or lowers the arm 42.

The nozzle 41 is connected to a top coating liquid supply source (45a), a peeling processing liquid supply source (45b) and a dissolution processing liquid supply source (45c) respectively via valves (44a-44c). In the present embodiment, as the peeling processing liquid, HFE is used which is a non-polar solvent. Further, as the dissolution processing liquid, IPA is used which is a polar solvent.

The first liquid supply part 40 is structured as described above and supplies the top coating liquid, the peeling processing liquid or the dissolution processing liquid to the wafer (W).

The second liquid supply part 50 supplies various processing liquids to a back surface of the wafer (W) held by the substrate holding mechanism 30. The second liquid supply part 50 includes a nozzle 51, a nozzle 52, and a shaft part 53.

The nozzle 51 is connected to the dissolution processing liquid supply source (45c) via a valve (55a). The nozzle 52 is connected to the peeling processing liquid supply source (45b) via a valve (55b). The shaft part 53 is positioned at a rotation center of the rotation holding part 31, and is surrounded by the support part 32.

Supply pipes for supplying processing liquids from the valves (55a, 55b) to the nozzles (51, 52) are positioned inside the shaft part 53. The nozzle 52 extends vertically upward, and a front end of a discharge port of the nozzle 52 faces a center of the back surface of the wafer (W). On the other hand, the nozzle 51 extends toward an outer periphery of the rotation holding part 31 where the holding member 311 is provided, and a front end of the nozzle 51 faces a peripheral edge portion of the back surface of the wafer (W).

The collection cup 60 is positioned so as to surround the rotation holding part 31 and collects a processing liquid scattering from the wafer (W) by the rotation of the rotation holding part 31. At a bottom part of the collection cup 60, a drain port 61 is formed, and the processing liquid collected by the collection cup 60 is discharged from the drain port 61 to the outside of the substrate cleaning apparatus 14. Further, at the bottom part of the collection cup 60, an exhaust port 62 is formed that discharges the down flow gas supplied from the FFU 21 to the outside of the substrate cleaning apparatus 14.

Specific Operation of Substrate Cleaning System

Figure 4:
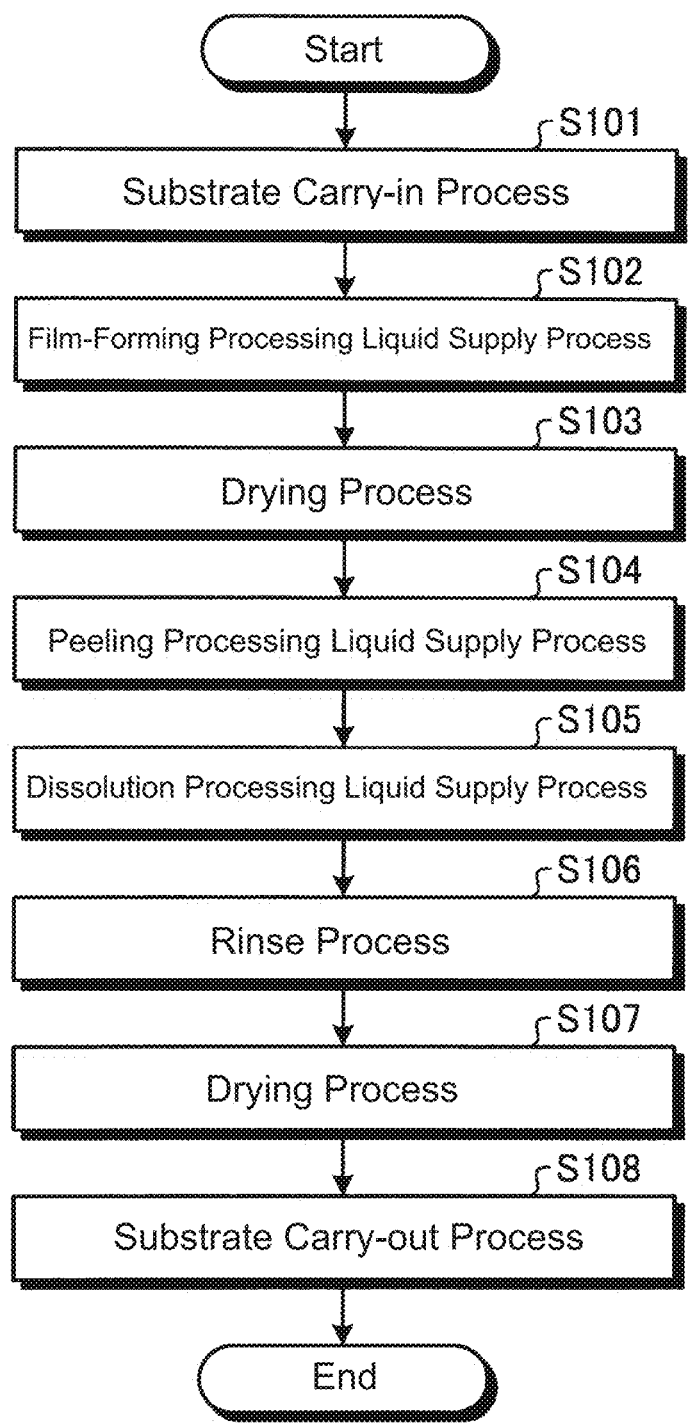
FIG. 4 is a flowchart illustrating processing stages of a substrate cleaning process performed by the substrate cleaning apparatus according to the first embodiment.

A specific operation of the substrate cleaning apparatus 14 is described with reference to FIGS. 4 and 5A-5D. In the present embodiment, a substrate in a surface of which a film composed of Ge (germanium) is formed is considered. FIG. 4 is a flowchart illustrating processing stages of a substrate cleaning process performed by the substrate cleaning apparatus 14 according to the present embodiment. FIG. 5A-5D are operation explanatory diagrams of the substrate cleaning apparatus 14.

As illustrated in FIG. 4, in the substrate cleaning apparatus 14, first, a substrate carry-in process is performed (Stage S101). In the substrate carry-in process, a wafer (W) carried into the chamber 20 by the substrate carrying device 131 (see FIG. 2) is held by the holding member 311 of the substrate holding mechanism 30.

In this case, the wafer (W) is held by the holding member 311 in a state in which the pattern forming surface faces upward. Thereafter, the rotation holding part 31 is rotated by the drive part. As a result, the wafer (W) rotates together with the rotation holding part 31 in a state of being horizontally held by the rotation holding part 31.

In the substrate cleaning apparatus 14, a film-forming processing liquid supply process is performed (Stage S102).

Figure 5A:
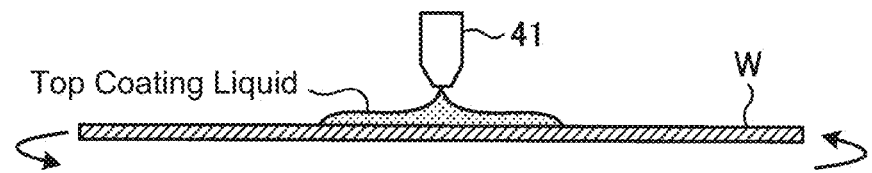
FIG. 5A is an operation explanatory diagram of a first substrate cleaning apparatus.

In the film-forming processing liquid supply process, as illustrated in FIG. 5A, a top coating liquid, which is a film-forming processing liquid, is supplied to the pattern forming surface of the wafer (W) on which a resist is not formed. In this way, the top coating liquid is supplied onto the wafer (W) without involving a resist.

Figure 5B:
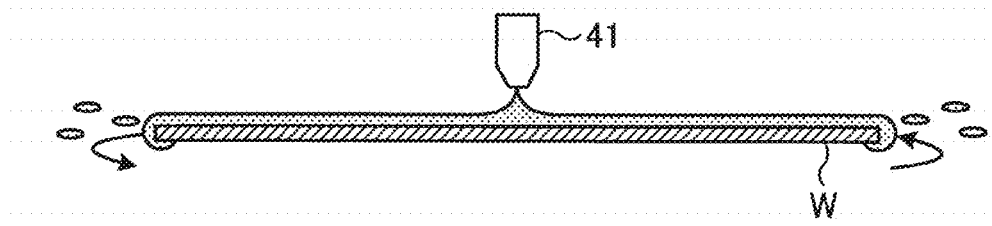
FIG. 5B is an operation explanatory diagram of the first substrate cleaning apparatus.

As illustrated in FIG. 5B, the top coating liquid supplied to the wafer (W) spreads on the surface of the wafer (W) due to a centrifugal force associated with the rotation of the wafer (W). Then, the top coating liquid solidifies or cures while volume shrinkage occurs due to volatilization of the volatile component, and thereby, a liquid film of the top coating liquid is formed on the pattern forming surface of the wafer (W).

In the substrate cleaning apparatus 14, a drying process is performed (Stage S103). In the drying process, the top coating liquid is dried, for example, by increasing a rotation speed of the wafer (W) for a predetermined period of time. As a result, volatilization of the volatile component contained in the top coating liquid is promoted, and the top coating liquid solidifies or cures and a top coating film is formed on the pattern forming surface of the wafer (W).

As illustrated in FIG. 5B, the top coating liquid supplied to a main surface of the wafer (W) slightly wraps around from the peripheral edge portion of the wafer (W) to the back surface of the wafer (W). Therefore, when the drying process is performed, the top coating film is also formed on a bevel portion and a peripheral edge portion on the back surface side of the wafer (W). Even before the drying process is performed and during the supply of the top coating liquid, solidification and curing of the top coating liquid are progressing, and thus, there is a risk that the top coating film may be formed.

Figure 5C:
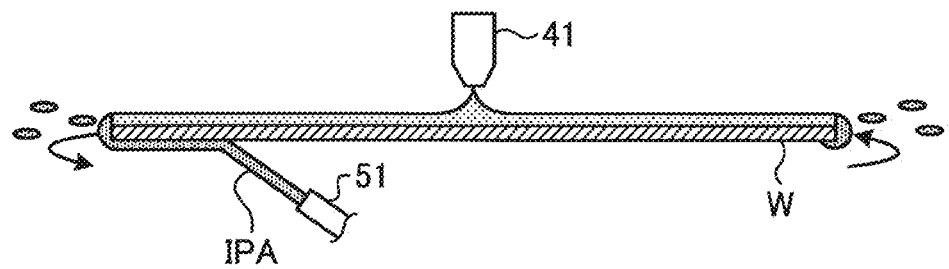
FIG. 5C is an operation explanatory diagram of the first substrate cleaning apparatus.

Therefore, after the supply of the top coating liquid from the nozzle 41 to the main surface of the wafer (W) is started and before the supply is finished, as illustrated in FIG. 5C, a dissolution processing liquid (here IPA) is supplied from the nozzle 51 of the second liquid supply part 50 to the peripheral edge portion of the back surface side of the wafer (W).

Figure 5D:
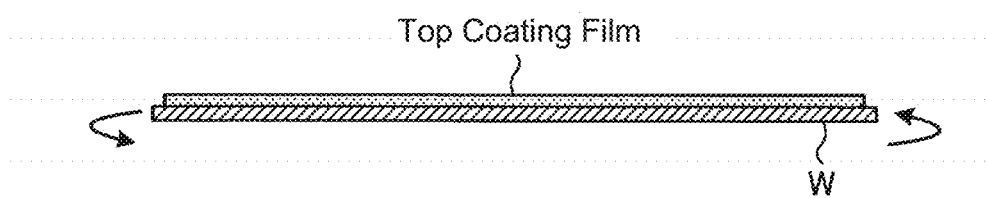
FIG. 5D is an operation explanatory diagram of the first substrate cleaning apparatus.

After being supplied to the peripheral edge portion on the back side of the wafer (W), the IPA wraps around from the bevel portion of the wafer (W) to the peripheral edge portion on the main surface side. As a result, as illustrated in FIG. 5D, the top coating film or the top coating liquid adhered to the peripheral edge portion on the back side, the bevel portion and the peripheral edge portion on the main surface side of the wafer (W) are dissolved and removed. Thereafter, the rotation of the wafer (W) is stopped.

In the present embodiment, the nozzle 51 is inclined, the front end of the nozzle 51 faces the peripheral edge portion where the top coating film is formed, and the dissolution processing liquid is directly supplied to the peripheral edge portion. Therefore, the top coating film can be dissolved with a smaller amount of the dissolution processing liquid as compared to a case where the dissolution processing liquid is supplied to the center position of the back surface of the substrate and then to the peripheral edge portion by utilizing the centrifugal force.

After the top coating liquid is solidified or cured by the drying process and the top coating film is formed, in the substrate cleaning apparatus 14, a peeling processing liquid supply process is performed (Stage S104). In the peeling processing liquid supply process, HFE, which is a peeling processing liquid, is supplied from the nozzle 41 and the nozzle 52 to the top coating film formed on the wafer (W).

The HFE supplied to the top coating film spreads on the top coating film due to the centrifugal force associated with the rotation of the wafer (W).

The HFE penetrates into the top coating film and reaches the interface of the wafer (W), and penetrates into the interface (the pattern forming surface) of the wafer (W) to peel off the top coating film from the wafer (W). As a result, the particles (P) attached to the pattern forming surface of the wafer (W) are peeled off from the wafer (W) together with the top coating film.

In the substrate cleaning apparatus 14, a dissolution processing liquid supply process is performed (Stage S105). In the dissolution processing liquid supply process, IPA, which is a dissolution processing liquid, is supplied from the nozzle 41 and the nozzle 51 to the top coating film peeled off from the wafer (W). As a result, the top coating film is dissolved.

In the substrate cleaning apparatus 14, a rinse process is performed (Stage S106). In the rinse process, the IPA is supplied from the nozzle 41 and the nozzle 51 to the rotating wafer (W) at a relatively larger flow rate as compared to that in Stage S105, and thereby, the dissolved top coating film and the particles (P) floating in the IPA are removed from the wafer (W) together with the IPA.

In the substrate cleaning apparatus 14, a drying process is performed (Stage S107). In the drying process, the wafer (W) is dried, for example, by shaving off the IPA remaining on the surface of the wafer (W) by increasing the rotation speed of the wafer (W) for a predetermined period of time. Thereafter, the rotation of the wafer (W) is stopped.

In the substrate cleaning apparatus 14, a substrate carry-out process is performed (Stage S108). In the substrate carry-out process, the wafer (W) is taken out from the chamber 20 of the substrate cleaning apparatus 14 by the substrate carrying device 131 (see FIG. 2).

Thereafter, the wafer (W) is accommodated in the carrier (C) placed in the carrier mounting part 11 via the delivery part 122 and the substrate carrying device 121. When the substrate carry-out process is completed, the substrate cleaning process for one wafer (W) is completed.

The substrate cleaning system 1 according to the present embodiment includes a film-forming processing liquid supply part (the first liquid supply part 40), a peeling processing liquid supply part (the first liquid supply part 40 and the second liquid supply part 50), and a dissolution processing liquid supply part (the first liquid supply part 40 and the second liquid supply part 50).

The film-forming processing liquid supply part supplies, to a wafer (W) having a hydrophilic surface, a film-forming processing liquid (top coating liquid) that contains a volatile component and is for forming a film on the wafer (W). The peeling processing liquid supply part supplies, to the film-forming processing liquid (top coating film) solidified or cured on the wafer (W) due to volatilization of the volatile component, a peeling processing liquid (HFE) that peels off the film-forming processing liquid (top coating film) from the wafer (W).

Then, the dissolution processing liquid supply part supplies, to the solidified or cured film-forming processing liquid (top coating film), a dissolution processing liquid (IPA) that dissolves the film-forming processing liquid (top coating film).

According to the substrate cleaning system 1 of the present embodiment, the particles (P) having small particle sizes attached to the wafer (W) can be removed without affecting the surface of the substrate.

In the present embodiment, as the peeling processing liquid, HFE is used which is a non-polar solvent, and as the dissolution processing liquid, IPA is used which is a polar solvent. As a result, the cleaning process can be performed without affecting the surface of the wafer (W) such as causing dissolution or corrosion.

The present invention is not limited to the above examples. As the peeling processing liquid, any one of HFC, HFO, and PFC, which are non-polar solvents, can be sued, and as the dissolution processing liquid, any one of alcohols (other than IPA), PGMEA, PGME, and MIBC, which are polar solvents, can be used. It is also possible that a small amount of a polar organic solvent is mixed in the peeling processing liquid. The small amount of the polar organic solvent slightly dissolves the film, and thereby, the non-polar solvent can easily permeate into the film and the interface with the substrate, and thus, peelability of the film can be improved.

This can be similarly applied even when metal materials of magnetoresistive memories such as Ge and MRAM are used for the wafer (W). Further, without being limited to a substrate on a surface which a film composed of Ge (germanium) is formed, the same cleaning can also be performed with respect to a substrate on which a film composed of a III-V group material or a metal material for MRAM is formed.

The film-forming processing liquid is not limited to a top coating liquid, but may be any liquid containing a synthetic resin that is a polar organic material that cures and shrinks by a drying process and appropriately peels and dissolves in relation to a peeling processing liquid and a dissolution processing liquid. For example, other processing liquids such as a resist liquid containing a phenol resin can be used.

Pre-processing of the cleaning process is not limited. For example, it is possible that a wafer (W) on which polymers or particles are attached after dry etching is subjected to wet cleaning using an organic cleaning liquid and thereafter the process illustrated in FIG. 4 is started.

Second Embodiment

Content of Substrate Cleaning Method

A substrate processing method according to a second embodiment allows a wafer (W) to be processed without being constrained by a Q-time, the wafer (W) having a metal wiring formed therein that is at least partially exposed.

Here, the term "Q-time" refers to a time limit that is set with respect to a time period after the wafer (W) is subjected to, for example, dry etching in order to prevent oxidation or the like of the metal wiring exposed by the dry etching.

When a Q-time is set, time management is necessary in order to comply with the Q-time. Therefore, there is a risk that productivity may decrease due to an increase in man-hours. Further, when the set Q-time is short, line management becomes difficult. Therefore, there is also a concern that the productivity may decrease due to complication of the line management.

Figure 6:
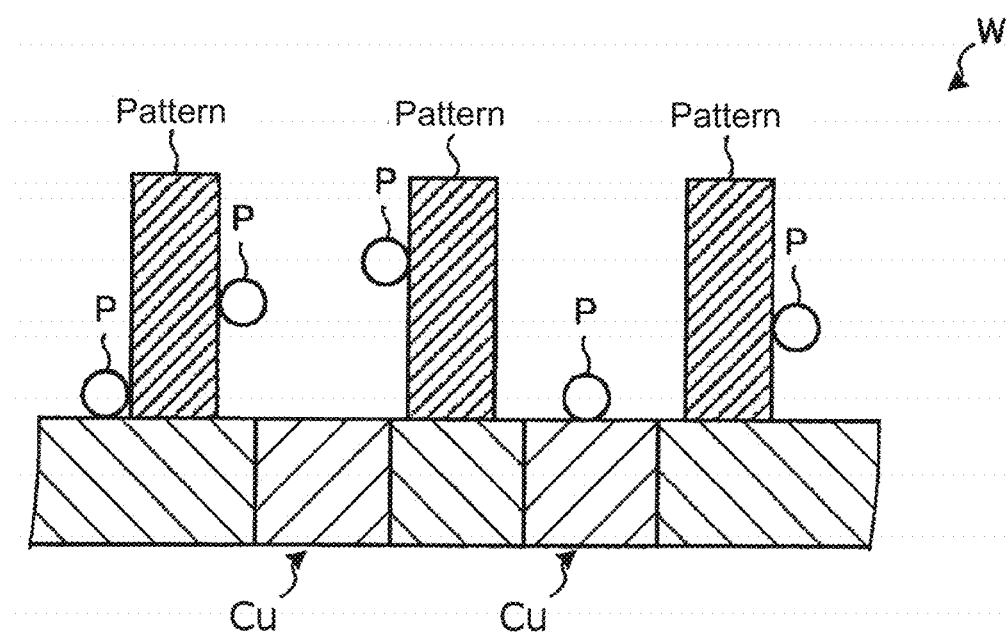
FIG. 6 is a schematic diagram illustrating a structure of a wafer (W) according to a second embodiment.

As illustrated in FIG. 6, in the present embodiment, the wafer (W) has a wiring layer on a bottom surface, and a Cu wiring, which is an example of a metal wiring, is formed in the wiring layer. Here, the reference symbol "P" indicates unwanted substances, which, in addition to the particles in the first embodiment, also include reaction products such as polymers generated by dry etching or ashing.

Figure 7A:
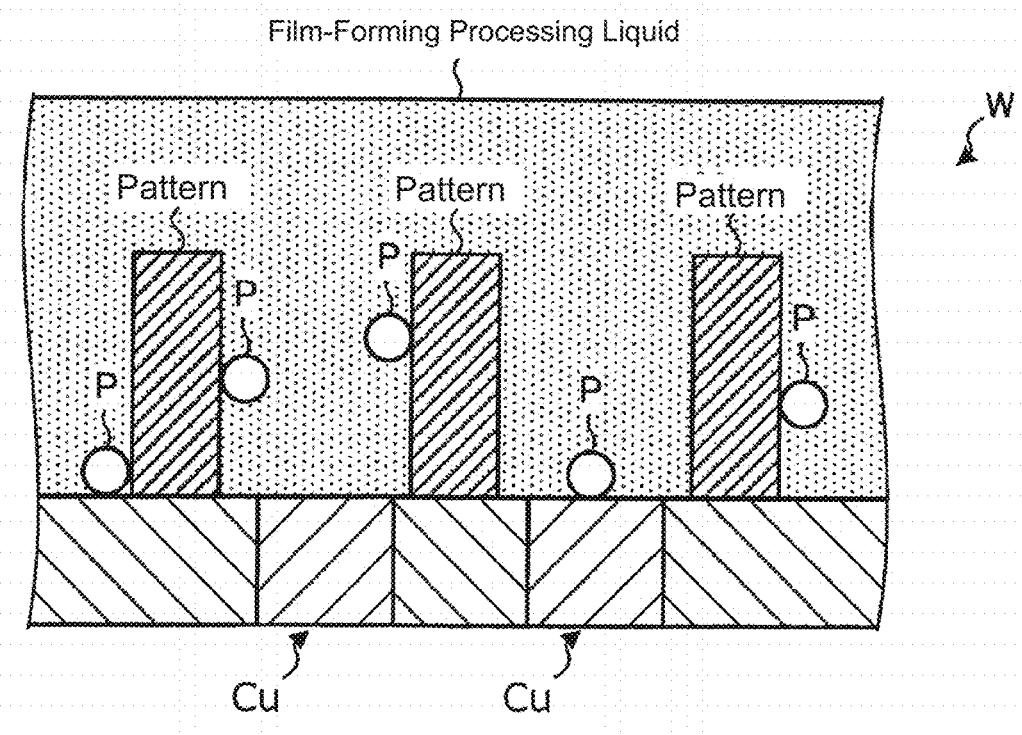
FIG. 7A is an explanatory diagram of a substrate cleaning method according to the second embodiment.

In the substrate processing method according to the present embodiment, as illustrated in FIG. 7A, a film-forming processing liquid same as that in the first embodiment is supplied onto the wafer (W).

When a top coating film is formed on the wafer (W), the Cu wiring exposed by dry etching is in a state of being covered by the top coating film. The wafer (W) in this state is accommodated in a carrying container.

In this way, according to the substrate processing method of the present embodiment, by protecting the exposed Cu wiring with the top coating film, the exposed Cu wiring is not subjected to an adverse effect such as oxidation, and thus it is not necessary to set a Q-time. Since a Q-time is unnecessary, time management for compliance with a Q-time becomes unnecessary, and complication of line management due to compliance with a Q-time can be prevented. Therefore, according to the substrate processing method of the present embodiment, productivity can be improved.

The reaction products (P) grow due to a reaction between a residual gas of dry etching and moisture or oxygen in the atmosphere. In contrast, according to the substrate processing method of the present embodiment, by protecting the exposed Cu wiring with the top coating film, growth of the reaction products (P) can be suppressed. Therefore, adverse effects such as degradation in electrical characteristics and reduction in yield due to the reaction products (P) can be prevented.

In the substrate processing method according to the present embodiment, after the wafer (W) accommodated in the carrying container is taken out, by removing the top coating film formed on the wafer (W), a process in which the unwanted substances (P) are removed is performed.

FIG. 7A-7E are explanatory diagrams of the substrate cleaning method according to the present embodiment. An only difference from FIG. 1A-1E, which are the explanatory diagrams of the first embodiment, is the presence or absence of the Cu wiring. The film-forming processing liquid, the peeling processing liquid and the dissolution processing liquid that are used are the same those in the first embodiment. Therefore, similar to the first embodiment, the unwanted substances (particles and reaction products) (P) having small particle sizes attached to the wafer (W) can be removed without affecting the surface of the substrate. In addition, the substrate cleaning method of the present embodiment is applied to the following substrate processing system in order to make a Q-time unnecessary.

Structure of Substrate Processing System

Figure 8:
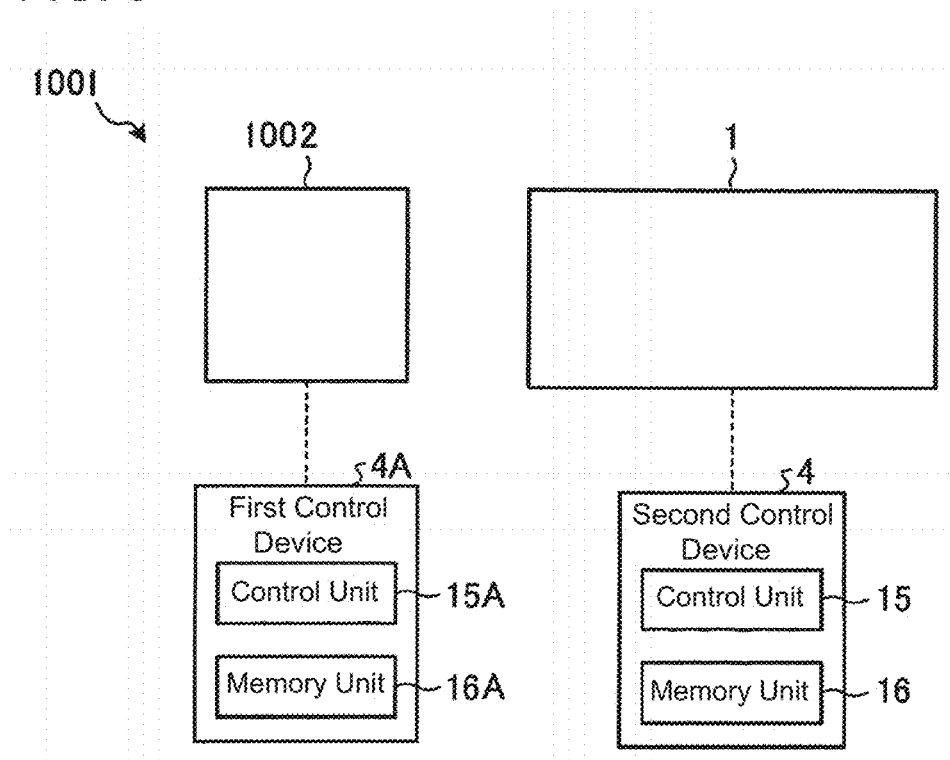
FIG. 8 is a schematic diagram illustrating a structure of a substrate cleaning system according to the second embodiment.

A structure of a substrate processing system that executes the above-described substrate processing method is described with reference to FIG. 8. FIG. 8 illustrates a schematic structure of a substrate processing system according to the second embodiment.

As illustrated in FIG. 8, a substrate processing system 1001 according to the second embodiment includes a first processing apparatus 1002 as a pre-processing apparatus, and a second processing apparatus 1 as a post-processing apparatus. Further, the substrate processing system 1001 includes a first control device (4A) and a second control device 4.

The first processing apparatus 1002 performs dry etching and supply of a top coating liquid with respect to the wafer (W). Further, the second processing apparatus 1 performs supply of a peeling processing liquid and a dissolution processing liquid with respect to the wafer (W) that has been processed by the first processing apparatus 1002. The second processing apparatus 1 has the same structure as that of the substrate cleaning system 1 in the first embodiment, and the present embodiment differs from the first embodiment in a method controlling the system. Therefore, in the present embodiment, description about the structure is omitted, and details of the control method will be described later.

The first control device (4A) is, for example, a computer, and includes a controller (15A) and a memory (15B). The memory (15B) is foil led from a storage device such as a RAM (Random Access Memory), a ROM (Read Only Memory), or a hard disk, and stores a program that controls various processes performed in the first processing apparatus 1002. The controller (15A) is, for example, a CPU (Central Processing Unit), and controls operation of the first processing apparatus 1002 by reading out and executing the program stored in the memory (15B).

These programs may be recorded in a computer readable memory medium and may be installed from the memory medium to the memory (15B) of the first control device (4A) and the memory 15 of the second control device 4. Examples of computer readable memory medium include a hard disk (HD), a flexible disk (FD), a compact disc (CD), a magnetic optical disc (MO), a memory card, and the like.

Structure of First Processing Apparatus

Figure 9:
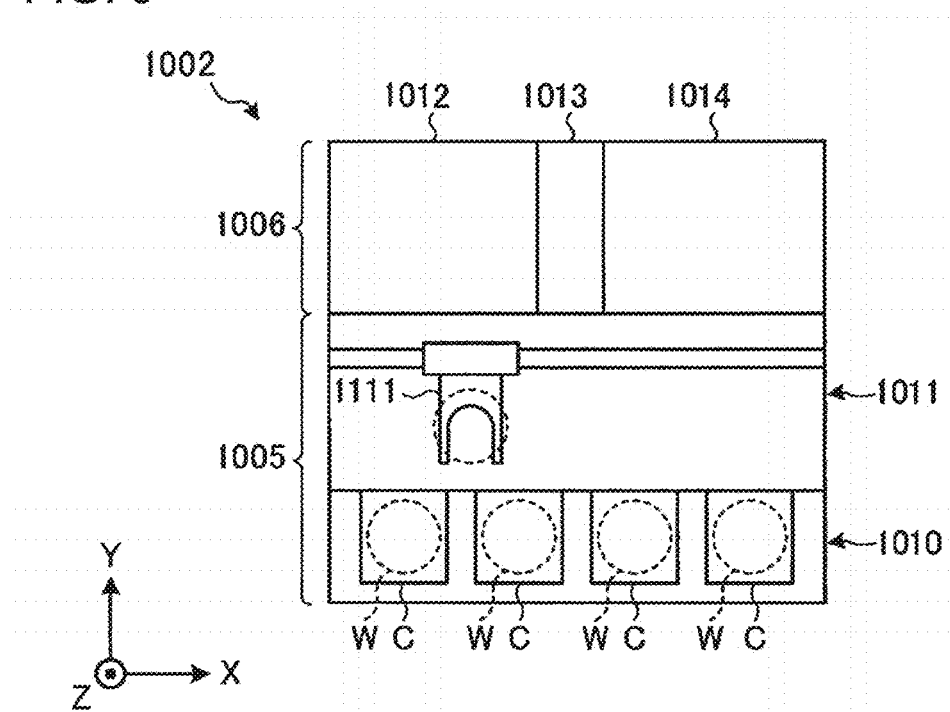
FIG. 9 is a schematic diagram illustrating a structure of a first processing apparatus according to the second embodiment.

A structure of the first processing apparatus 1002 is described with reference to FIG. 9. FIG. 9 illustrates a schematic structure of the first processing apparatus 1002. In the following description, in order to clarify positional relationship, an X axis, a Y axis and a Z axis that are orthogonal to each other are defined, and the Z axis positive direction is defined as a vertical upward direction.

As illustrated FIG. 9, the first processing apparatus 1002 includes a loading and unloading station 1005 and a processing station 1006. The loading and unloading station 1005 and the processing station 1006 are provided adjacent to each other.

The loading and unloading station 1005 includes a mounting part 1010 and a carrying part 1011. Multiple carrying containers (hereinafter, referred to as "carriers (C)") accommodating multiple wafers (W) in a horizontal state are placed in the mounting part 1010.

The carrying part 1011 is provided adjacent to the mounting part 1010, and includes therein a substrate carrying device 1111. The substrate carrying device 1111 includes a wafer holding mechanism that holds a wafer (W). Further, the substrate carrying device 1111 is capable of moving in a horizontal direction and a vertical direction and rotating about a vertical axis, and carries a wafer (W) between a carrier (C) and the processing station 1006 using the wafer holding mechanism.

Specifically, the substrate carrying device 1111 performs a process in which a wafer (W) is taken out from a carrier (C) placed in the mounting part 1010, and the taken out wafer (W) is carried to a dry etching unit 1012 (to be described later) of the processing station 1006. Further, the substrate carrying device 1111 also performs a process in which a wafer (W) is taken out from a first liquid processing unit 1014 of the processing station 1006 (to be described later) and the taken out wafer (W) is accommodated in a carrier (C) of the mounting part 1010.

The processing station 1006 is provided adjacent to the carrying part 1011. The processing station 1006 includes the dry etching unit 1012, a load lock chamber 1013, and the first liquid processing unit 1014.

The dry etching unit 1012 corresponds to an example of a pre-processing part, and performs a dry etching process with respect to the wafer (W) carried in by the substrate carrying device 1111. As a result, the Cu wiring 1102 (see FIG. 6) inside the wafer (W) is exposed.

The dry etching process is performed in a reduced pressure state. Further, in the dry etching unit 1012, an ashing process in which an unnecessary resist is removed may be performed after the dry etching process.

The load lock chamber 1013 is structured such that an internal pressure state can be switched between an atmospheric pressure state and a reduced pressure state. A substrate carrying device (not illustrated in the drawings) is provided inside the load lock chamber 1013. The wafer (W) that has been processed in the dry etching unit 1012 is carried out from the dry etching unit 1012 by the substrate carrying device (not illustrated in the drawings) of the load lock chamber 1013, and is carried into the first liquid processing unit 1014.

Specifically, the inside of the load lock chamber 1013 is kept in a reduced pressure state until the wafer (W) is carried out from the dry etching unit 1012, and, after the carrying out is completed, is switched to an atmospheric pressure state by supplying an inert gas such as a nitrogen or argon gas. Then, after switching to the atmospheric pressure state, the substrate carrying device (not illustrated in the drawings) of the load lock chamber 1013 carries the wafer (W) into the first liquid processing unit 1014.

In this way, the wafer (W) is isolated from outside air from when the wafer (W) is carried out from the dry etching unit 1012 to when the wafer (W) is carried into the first liquid processing unit 1014. Therefore, oxidation of the exposed Cu wiring is prevented.

The first liquid processing unit 1014 performs a film-forming processing liquid supply process in which a top coating liquid is supplied to the wafer (W). As described above, the top coating liquid supplied to the wafer (W) solidifies or cures to form a top coating film while volume shrinkage occurs. As a result, the exposed Cu wiring is in a state of being covered by the top coating film.

The wafer (W) after the film-forming processing liquid supply process is accommodated in a carrier (C) by the substrate carrying device 1111 and thereafter is carried to the second processing apparatus 1.

Structure of Dry Etching Unit

Figure 10:
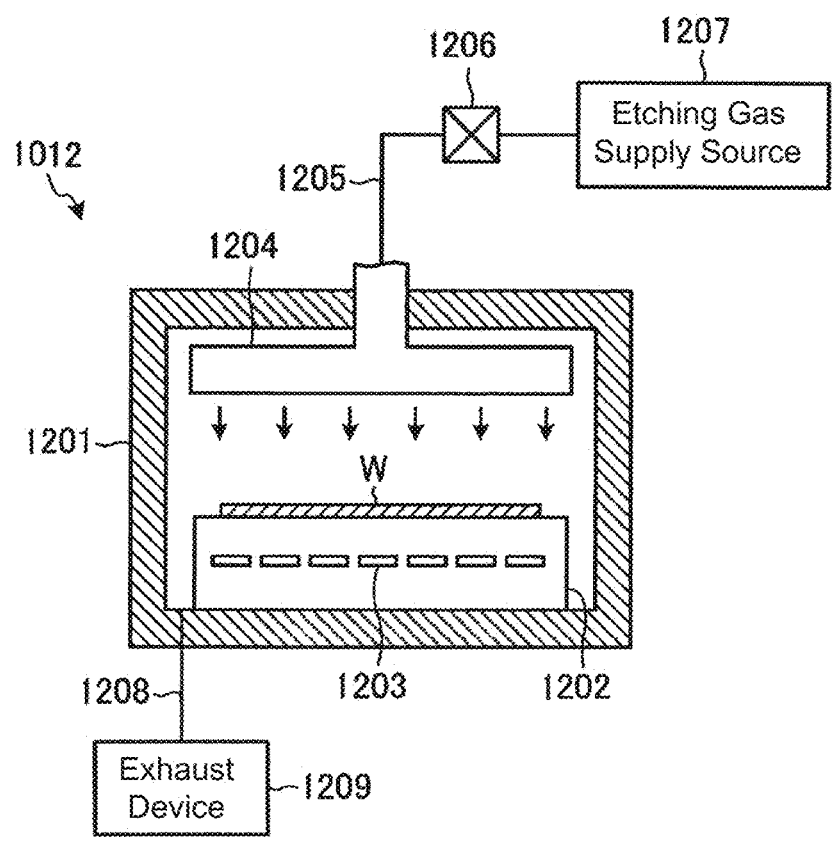
FIG. 10 is a schematic diagram illustrating a structure of a dry etching unit according to the second embodiment.

Next, structures of units included in the first processing apparatus 1002 are described. First, the structure of the dry etching unit 1012 is described with reference to FIG. 10. FIG. 10 is a schematic diagram illustrating an example of the structure of the dry etching unit 1012.

As illustrated in FIG. 10, the dry etching unit 1012 includes a chamber 1201 having a sealed structure in which the wafer (W) is accommodated, and a mounting table 1202 on which the wafer (W) is placed in a horizontal state is provided inside the chamber 1201. The mounting table 1202 includes a temperature control mechanism 1203 that adjusts the wafer (W) to a predetermined temperature by cooling or heating the wafer (W). A loading and unloading port (not illustrated in the drawings) for carrying in or out the wafer (W) between the dry etching unit 1012 and the load lock chamber 1013 is provided on a side wall of the chamber 1201.

A shower head 1204 is provided on a ceiling part of the chamber 1201. A gas supply pipe 1205 is connected to the shower head 1204. An etching gas supply source 1207 is connected to the gas supply pipe 1205 via a valve 1206. A predetermined etching gas is supplied from the etching gas supply source 1207 to the shower head 1204. The shower head 1204 supplies, into the chamber 1201, the etching gas supplied from the etching gas supply source 1207.

Examples of the etching gas supplied from the etching gas supply source 1207 include a $CH_3F$ gas, a $CH_2F_2$ gas, a $CF_4$ gas, an $O_2$ gas, an Ar gas and the like.

An exhaust device 1209 is connected to a bottom part of the chamber 1201 via an exhaust line 1208. An internal pressure of the chamber 1201 is maintained in a reduced pressure state by the exhaust device 1209.

The dry etching unit 1012 is structured as described above, and dry-etches the wafer (W) placed on the mounting table 1202 by supplying an etching gas from the shower head 1204 into the chamber 1201 while using the exhaust device 1209 to put the inside of the chamber 1201 in a reduced pressure state. As a result, the Cu plating is in a state of being exposed.

Structure of First Liquid Processing Unit

Figure 11:
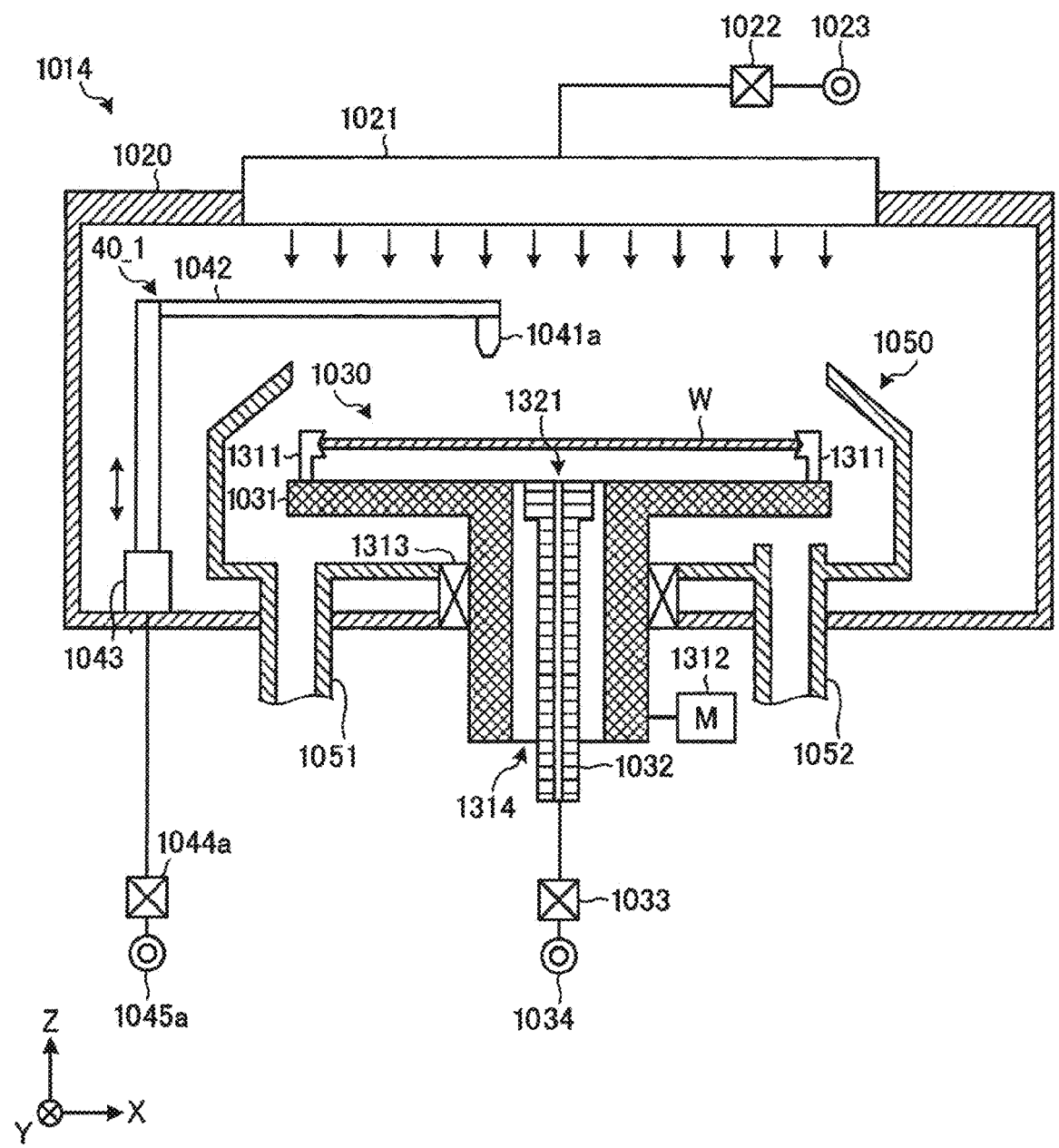
FIG. 11 is a schematic diagram illustrating a structure of a first liquid processing unit according to the second embodiment.

Next, a structure of the first liquid processing unit 1014 of the first processing apparatus 1002 is described with reference to FIG. 11. FIG. 11 is a schematic diagram illustrating an example of the structure of the first liquid processing unit 1014.

As illustrated in FIG. 11, the first liquid processing unit 1014 includes a chamber 1020, a substrate holding mechanism 1030, a liquid supply part 40_1, and a collection cup 1050.

The chamber 1020 accommodates the substrate holding mechanism 1030, the liquid supply part 40_1 and the collection cup 1050. An FFU (Fan Filter Unit) 21 is provided in a ceiling part of the chamber 1020. The FFU 1021 forms a down flow in the chamber 1020.

An inert gas supply source 1023 is connected to the FFU 1021 via a valve 1022. The FFU 1021 discharges, into the chamber 1020, an inert gas such as a $N_2$ gas supplied from the inert gas supply source 1023. In this way, by using an inert gas as a down flow gas, oxidation of the exposed Cu wiring can be prevented.

The substrate holding mechanism 1030 includes a rotation holding part 1031 that rotatably holds the wafer (W), and a fluid supply part 1032 that is inserted through a hollow part 1314 of the rotation holding part 1031 and supplies a gas to a lower surface of the wafer (W).

The rotation holding part 1031 is provided substantially at a center of the chamber 1020. A holding member 1311 that holds the wafer (W) from a lateral side is provided on an upper surface of the rotation holding part 1031. The wafer (W) is horizontally held by the holding member 311 in a state of being slightly separated from the upper surface of the rotation holding part 1031.

The substrate holding mechanism 1030 includes a drive mechanism 1312 that includes a motor, a belt transmitting rotation of the motor to the rotation holding part 1031, and the like. Due to the drive mechanism 1312, the rotation holding part 1031 rotates around a vertical axis. Then, due to the rotation of the rotation holding part 1031, the wafer (W) held by the rotation holding part 1031 integrally rotates with the rotation holding part 1031. The rotation holding part 1031 is rotatably supported by the chamber 1020 and the collection cup 1050 via a bearing 1313.

The fluid supply part 1032 is inserted through the hollow part 1314 formed at a center of the rotation holding part 1031. A flow channel 1321 is formed inside the fluid supply part 1032, and a $N_2$ supply source 1034 is connected to the flow channel 1321 via a valve 1033. The fluid supply part 1032 supplies a $N_2$ gas supplied from the $N_2$ supply source 1034 to the lower surface of the wafer (W) via the valve 1033 and the flow channel 1321.

The $N_2$ gas supplied via the valve 1033 is a $N_2$ gas at a high temperature (for example, about 90° C.), and is used in a volatilization promotion process (to be described later).

When a wafer (W) is received from the substrate carrying device (not illustrated in the drawings) of the load lock chamber 1013, the substrate holding mechanism 1030 places the wafer (W) on support pins (not illustrated in the drawings) provided on an upper surface of the fluid supply part 1032 in a state in which the fluid supply part 1032 is raised using a lift mechanism (not illustrated in the drawings). Thereafter, the substrate holding mechanism 1030 lowers the fluid supply part 1032 to a predetermined position and then passes the wafer (W) to the holding member 1311 of the rotation holding part 1031. Further, when passing the processed wafer (W) to the substrate carrying device 1111, the substrate holding mechanism 1030 raises the fluid supply part 1032 using the lift mechanism (not illustrated in the drawings) and places the wafer (W) held by the holding member 1311 on the support pins (not illustrated in the drawings). Then, the substrate holding mechanism 1030 passes the wafer (W) placed on the support pins (not illustrated in the drawings) to the substrate carrying device 1111.

The liquid supply part 40_1 includes a nozzle (1041*a*), an arm 1042, and a tuning and lifting mechanism 1043. A top coating liquid supply source (1045*a*) is connected to the nozzle (1041*a*) via a valve (1044*a*). The liquid supply part 40_1 supplies a top coating liquid from the nozzle (1041*a*).

The collection cup 1050 is positioned so as to surround the rotation holding part 1031 and collects a processing liquid scattering from the wafer (W) by the rotation of the rotation holding part 1031. At a bottom part of the collection cup 1050, a drain port 1051 is formed, and the processing liquid collected by the collection cup 1050 is discharged from the drain port 1051 to the outside of the first liquid processing unit 1014. Further, at the bottom part of the collection cup 1050, an exhaust port 1052 is formed that discharges a $N_2$ gas supplied from the fluid supply part 1032 or an inert gas supplied from the FFU 1021 to the outside of the substrate cleaning apparatus 14.

Specific Operation of Substrate Processing System

Figure 12:
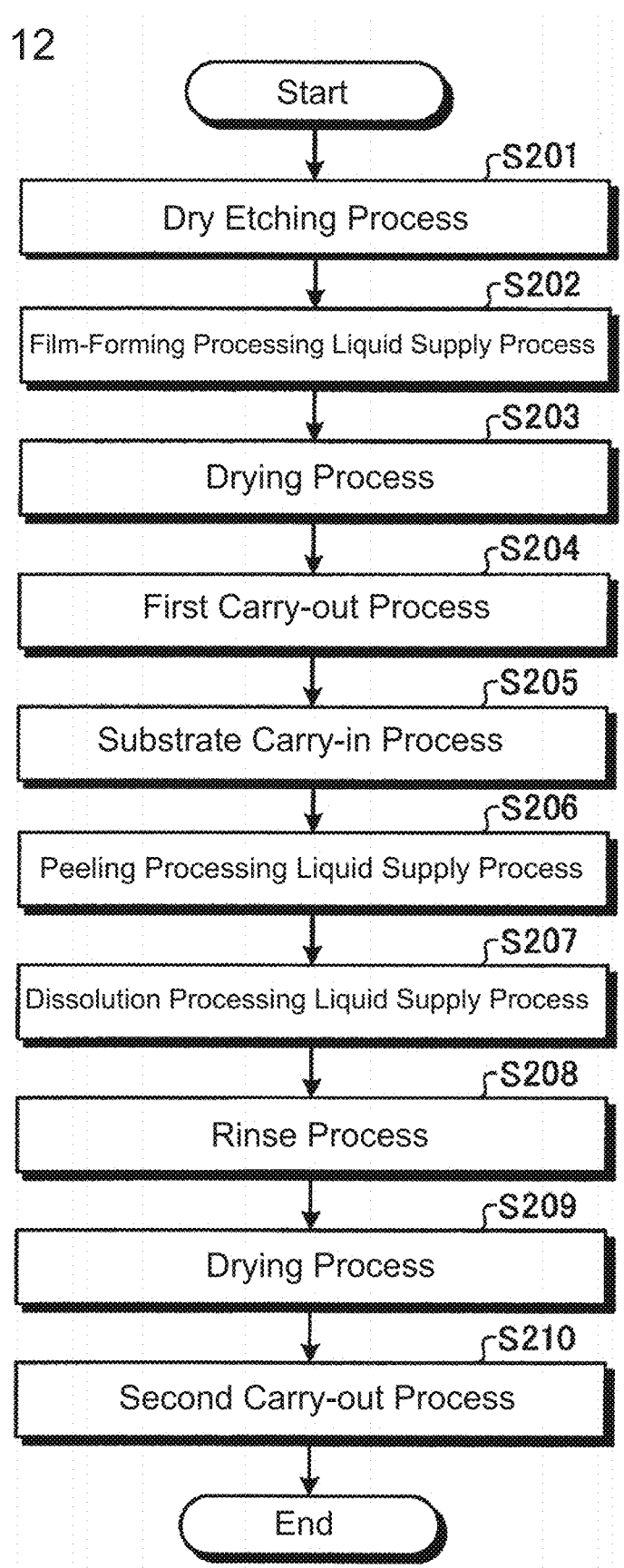
FIG. 12 is a flowchart illustrating processing stages of a substrate cleaning process performed by a substrate cleaning apparatus according to the second embodiment.

A specific operation of the substrate processing system 1001 is described with reference to FIG. 12. FIG. 12 is a flowchart illustrating processing stages of a substrate cleaning process according to the second embodiment. The processing stages illustrated in FIG. 12 are performed under the control of the first control device (4A) or the second control device 4.

In the substrate processing system 1001 according to the present embodiment, of the processes illustrated in FIG. 12, processes from a dry etching process (Stage S201) to a first carry-out process (Stage S204) are performed in the first processing apparatus 1002, and processes from a substrate carry-in process (Stage S205) to a second carry-out process (Stage S210) are performed in the second processing apparatus 1.

As illustrated in FIG. 12, first, a dry etching process is performed in the dry etching unit 1012 (Stage S201). In the dry etching process, the dry etching unit 1012 performs dry etching and ashing with respect to the wafer (W). As a result, the Cu wiring provided inside the wafer (W) is exposed (see FIG. 6).

The wafer (W) is carried into the first liquid processing unit 1014. Since the carry-in process is performed via the load lock chamber 1013, oxidation of the exposed Cu wiring can be prevented.

In the first liquid processing unit 1014, a film-forming processing liquid supply process is performed (Stage S202). In the film-forming processing liquid supply process, the nozzle (1041*a*) of the liquid supply part 40_1 is positioned above a center of the wafer (W). Thereafter, a top coating liquid, which is a film-forming processing liquid, is supplied from the nozzle (1041*a*) to a main surface of the wafer (W), the main surface being is a circuit forming surface on which a resist film is not formed.

The top coating liquid supplied to the wafer (W) spreads on the main surface of the wafer (W) due to a centrifugal force associated with the rotation of the wafer (W). As a result, a liquid film of the top coating liquid is formed on the entire main surface of the wafer (W) (see FIG. 7A).

In the first liquid processing unit 1014, a drying process is performed (Stage S203). In the drying process, the top coating liquid is dried, for example, by increasing a rotation speed of the wafer (W) for a predetermined period of time. As a result, volatilization of the volatile component contained in the top coating liquid is promoted, and the top coating liquid solidifies or cures and a top coating film is formed on the entire main surface of the wafer (W).

In the first liquid processing unit 1014, a first carry-out process is performed (Stage S204). In the first carry-out process, the substrate carrying device 1111 takes out the wafer (W) from the first liquid processing unit 1014, and carries the wafer (W) to the mounting part 1010 and accommodates the wafer (W) in a carrier (C) placed in the mounting part 1010.

In this case, the exposed Cu wiring of the wafer (W) is covered by the top coating film in a short time period after the dry etching. That is, the Cu wiring is in a state of being isolated from outside air and thus is not subjected to an adverse effect such as oxidation.

According to the substrate processing system 1001 of the present embodiment, time management for compliance with a Q-time from after the dry etching to the cleaning is unnecessary and thus productivity can be improved.

A substrate carry-in process is performed (Stage S205). In the substrate carry-in process, the wafer (W) accommodated in the carrier (C) is carried from the first processing apparatus 1002 to the mounting part 11 of the second processing apparatus 1. Thereafter, the wafer (W) is taken out from the carrier (C) by the substrate carrying device 121 (see FIG. 2) of the second processing apparatus 1, and is carried to a substrate cleaning apparatus 14 via the delivery part 122 and the substrate carrying device 131.

Then, the wafer (W) carried into the chamber 20 is held by the holding member 311 of the substrate holding mechanism 30. In this case, the wafer (W) is held by the holding member 311 in a state in which the pattern forming surface faces upward. Thereafter, the rotation holding part 31 is rotated by the drive part. As a result, the wafer (W) rotates together with the rotation holding part 31 in a state of being horizontally held by the rotation holding part 31.

In the substrate cleaning apparatus 14, a peeling processing liquid supply process is performed (Stage S206). In the peeling processing liquid supply process, HFE, which is a peeling processing liquid, is supplied from the nozzle 41 and the nozzle 52 to the top coating film formed on the wafer (W). The HFE supplied to the top coating film spreads on the top coating film due to the centrifugal force associated with the rotation of the wafer (W) (see FIG. 7B).

The HFE penetrates into the top coating film and reaches the interface of the wafer (W), and penetrates into the interface (the pattern forming surface) of the wafer (W) to peel off the top coating film from the wafer (W). As a result, the unwanted substances (P) attached to the pattern forming surface of the wafer (W) are peeled off from the wafer (W) together with the top coating film (see FIG. 7C).

Figure 7B:
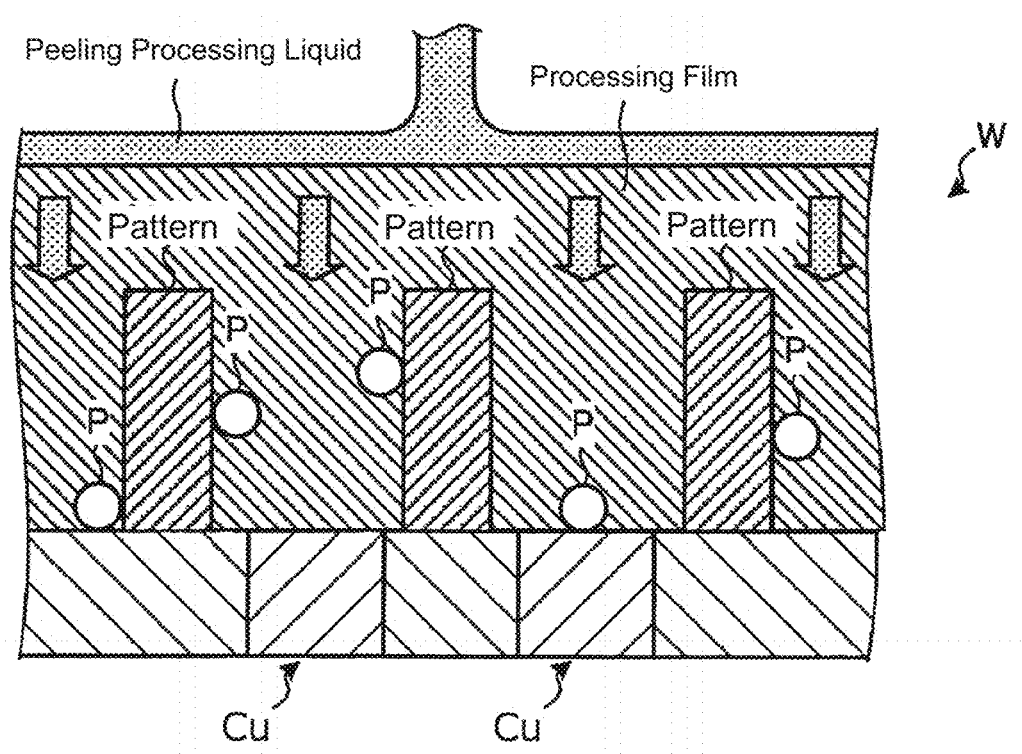
FIG. 7B is an explanatory diagram of the substrate cleaning method according to the second embodiment.
Figure 7C:
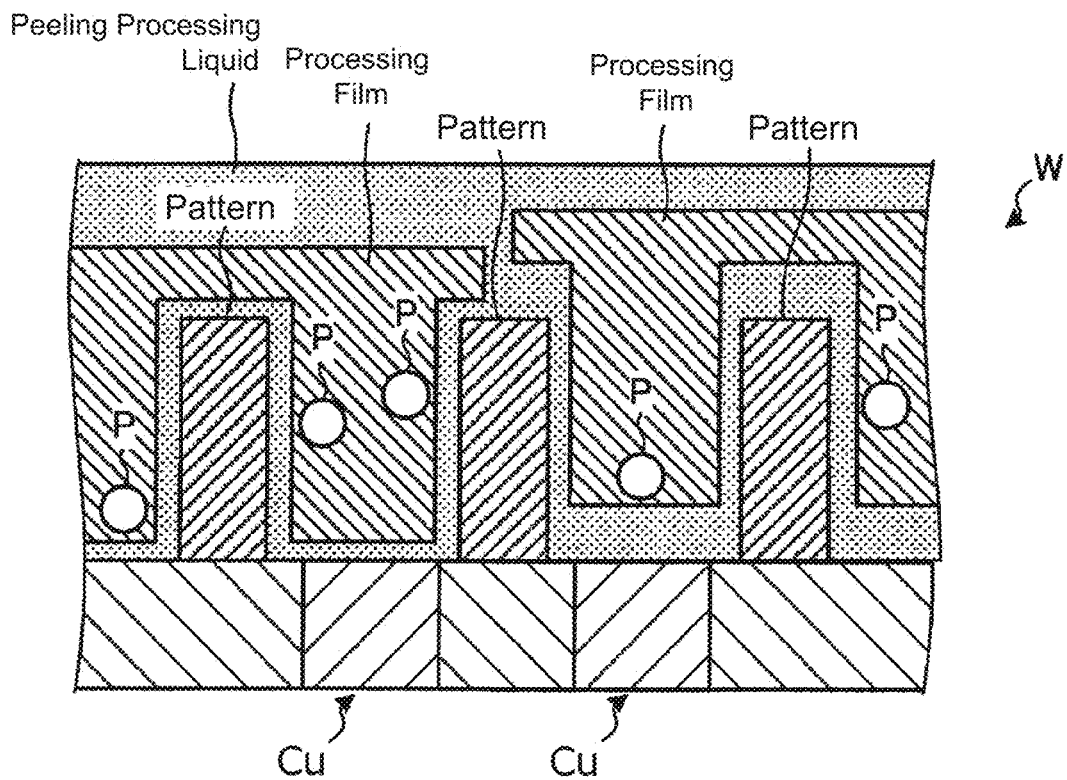
FIG. 7C is an explanatory diagram of the substrate cleaning method according to the second embodiment.
Figure 7D:
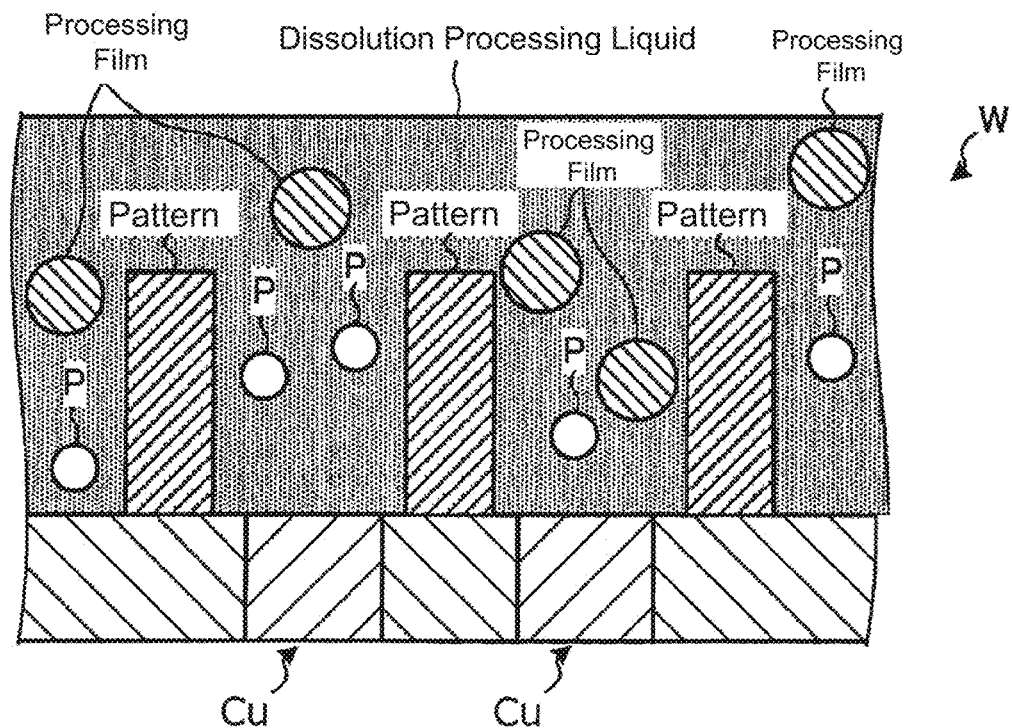
FIG. 7D is an explanatory diagram of the substrate cleaning method according to the second embodiment.
Figure 7E:
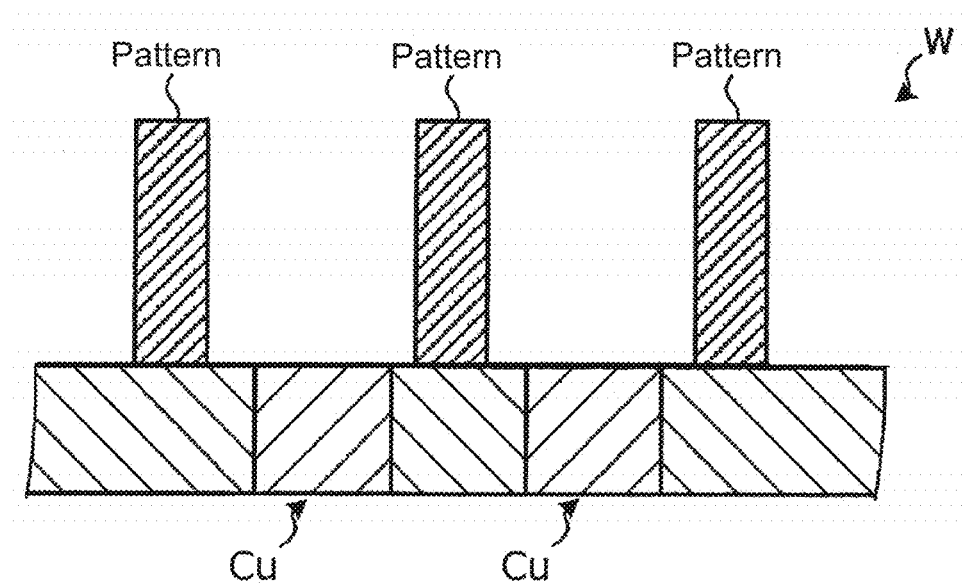
FIG. 7E is an explanatory diagram of the substrate cleaning method according to the second embodiment.

Here, in the present embodiment, the unwanted substances (P) include not only the particles but also reaction products generated by the dry etching. When a CF-based gas is used in the dry etching, the reaction products are fluorine-containing compounds and have, for example, a property of being soluble in HFE having a perfluoroalkyl group. In the state of FIG. 7B, most of the reaction products are separated from the wafer (W) by the volume shrinkage of the top coating liquid, but a small amount of the reaction products may remain on the wafer (W). Even in such a case, when the HFE is used, the HFE that permeates and reaches the interface of the wafer (W) can dissolve the small amount of remaining reaction products. This effect is not limited to HFE, and can also be achieved when other fluorine-based solvents such as HFC are used.

In the substrate cleaning apparatus 14, a dissolution processing liquid supply process is performed (Stage S207). In the dissolution processing liquid supply process, IPA, which is a dissolution processing liquid, is supplied from the nozzle 41 and the nozzle 51 to the top coating film peeled off from the wafer (W). As a result, the top coating film is dissolved.

In the substrate cleaning apparatus 14, a rinse process is performed (Stage S208). In the rinse process, the IPA is supplied from the nozzle 41 and the nozzle 51 to the rotating wafer (W) at a relatively larger flow rate as compared to that in Stage S207, and thereby, the dissolved top coating film and the unwanted substances (P) floating in the IPA are removed from the wafer (W) together with the IPA.

In the substrate cleaning apparatus 14, a drying process is performed (Stage S209). In the drying process, the wafer (W) is dried, for example, by shaving off the IPA remaining on the surface of the wafer (W) by increasing the rotation speed of the wafer (W) for a predetermined period of time. Thereafter, the rotation of the wafer (W) is stopped.

In the substrate cleaning apparatus 14, a second substrate carry-out process is performed (Stage S210). In the second substrate carry-out process, the wafer (W) is taken out from the chamber 20 of the substrate cleaning apparatus 14 by the substrate carrying device 131 (see FIG. 2).

Thereafter, the wafer (W) is accommodated in the carrier (C) placed in the carrier mounting part 11 via the delivery part 122 and the substrate carrying device 121. When the substrate carry-out process is completed, the substrate cleaning process for one wafer (W) is completed.

The substrate cleaning system 1001 according to the present embodiment includes the first processing apparatus 1002 and the second processing apparatus 1 (substrate cleaning system 1). After the film-forming processing liquid is supplied by the film-forming processing liquid supply part (liquid supply part 40_1) of the first processing apparatus 1002, the wafer (W), on which the top coating liquid solidifies or cures and a processing film is formed, is accommodated in the carrier (C). In the second processing apparatus 1, the wafer (W) accommodated in the carrier (C) is taken out and the peeling processing liquid is supplied. As a result, in addition to the effect of the first embodiment, the effect of improving productivity by relaxing the Q-time is obtained.

In the present embodiment, the substrate to be processed is a wafer (W) that has been subjected to dry etching or ashing in which at least a portion of a Cu wiring formed in the wafer (W) is exposed. However, the present invention is not limited to this, but is also applicable for substrates in which other metal wirings are exposed. Further, the present invention is not limited to metal wirings, but is also applicable for materials in which a substance such as Ge or a III-V group material, for which prevention of contact with oxygen is necessary, is exposed.

The film-forming processing liquid used in the first and second embodiments is not limited to a top coating liquid having properties actually applicable in a lithography process, but may be any liquid containing a polar organic material optimized such that the effects such as solidification or curing, peeling and dissolution described using FIG. 1A-1E or FIG. 7A-7E can be accurately performed.

In the substrate cleaning method of Japanese Patent Laid-Open Publication No. 2015-119164, a film-forming processing liquid that contains a volatile component and is for forming a film on a substrate is supplied to the substrate, and, with respect to a processing film formed on the substrate by solidification or curing of the film-forming processing liquid due to volatilization of the volatile component, a peeling processing liquid that peels off the processing film from the substrate is supplied. Thereafter, a dissolution processing liquid that dissolves the processing film is supplied to the processing film. As a result, unwanted substances having small particle sizes attached to the substrate are removed without adversely affecting the surface of the substrate.

However, the substrate cleaning method of Japanese Patent Laid-Open Publication No. 2015-119164 uses a peeling processing liquid and a dissolution processing liquid that contain water, and thus cannot be applied to a substrate formed of a material such as Ge (germanium) or a III-V group material that may react with water and dissolve. Further, the substrate cleaning method of Japanese Patent Laid-Open Publication No. 2015-119164 also cannot be applied to a substrate formed of a metal material of a magnetoresistive memory that may react with water and corrode.

A substrate cleaning method according to an embodiment of the present invention includes: a film-forming processing liquid supply process in which a film-forming processing liquid that contains a volatile component and is forming a film on a substrate is supplied to the substrate; a peeling processing liquid supply process in which, with respect to a processing film that is formed on the substrate by solidification or curing of the film-forming processing liquid due to volatilization of the volatile component, a peeling processing liquid that peels off the processing film from the substrate is supplied; and a dissolution processing liquid supply process in which, after the peeling processing liquid supply process, a dissolution processing liquid that dissolves the processing film is supplied to the processing film. The peeling processing liquid used in the peeling processing liquid supply process is a non-polar solvent that does not contain water. The dissolution processing liquid used in the dissolution processing liquid supply process is a polar solvent that does not contain water.

An embodiment of the present invention can remove unwanted substances attached to a substrate without adversely affecting a surface of the substrate that is formed of a material that reacts with water and dissolves or corrodes.

Obviously, numerous modifications and variations of the present invention are possible in light of the above teachings. It is therefore to be understood that within the scope of the appended claims, the invention may be practiced otherwise than as specifically described herein.

The invention claimed is:

1. A substrate cleaning method for cleaning a substrate comprising Ge or III-V group material, comprising:

supplying, onto a substrate comprising Ge or III-V group material, a film-forming processing liquid comprising a volatile component and a polar organic material that forms a processing film on the substrate after dry etching or ashing;

volatilizing the volatile component such that the film-fouling processing liquid solidifies or cures and forms the processing film on the substrate;

supplying, to the processing film formed on the substrate, a peeling processing liquid that peels off the processing film from the substrate and comprises a non-polar solvent and a polar organic solvent;

supplying, to the processing film, a dissolution processing liquid that dissolves the processing film and comprises a polar solvent after the supplying of the peeling processing liquid; and supplying, to the substrate, a rinse processing liquid comprising a polar solvent after the supplying of the dissolution processing liquid to the substrate, wherein the peeling processing liquid does not contain water and contains the polar organic solvent in an amount such that the polar organic solvent slightly dissolves the processing film and that the non-polar solvent permeates into the processing film and an interface between the processing film and the substrate, the dissolution processing liquid does not contain water, and the rinse processing liquid does not contain water.

2. The substrate cleaning method of claim 1, wherein the film-forming processing liquid includes a synthetic resin of a polar organic material.

3. The substrate cleaning method of claim 2, wherein the polar solvent in the dissolution processing liquid comprises at least one solvent selected from the group consisting of alcohol, PGMEA, PGME and MIBC, and the polar solvent in the rinse processing liquid comprises at least one solvent selected from the group consisting of alcohol, PGMEA, PGME and MIBC.

4. The substrate cleaning method of claim 2, wherein the non-polar solvent comprises a fluorine-based solvent.

5. The substrate cleaning method of claim 4, wherein the non-polar solvent comprises at least one solvent selected from the group consisting of HFE, HFC, HFO and PFC.

6. The substrate cleaning method of claim 2, wherein the substrate is a substrate having a film comprising the Ge or III-V group material.

7. The substrate cleaning method of claim 2, wherein the substrate is a substrate having a wiring pattern comprising a metal material.

8. The substrate cleaning method of claim 2, wherein the supplying of the film-forming processing liquid comprises supplying the dissolution processing liquid to a peripheral portion of a back surface of the substrate during the supplying of the film-forming processing liquid to a surface of the substrate or after the supplying of the film-forming processing liquid to the substrate.

9. The substrate cleaning method of claim 2, further comprising:

accommodating, in a carrying container, the substrate on which the processing film is formed after the supplying of the film-forming processing liquid; and taking out the substrate accommodated in the carrying container, wherein the supplying of the peeling processing liquid comprises supplying the peeling processing liquid to the substrate that is taken out from the carrying container.

10. The substrate cleaning method of claim 1, wherein the polar solvent in the dissolution processing liquid comprises at least one solvent selected from the group consisting of alcohol, PGMEA, PGME and MIBC, and the polar solvent in the rinse processing liquid comprises at least one solvent selected from the group consisting of alcohol, PGMEA, PGME and MIBC.

11. The substrate cleaning method of claim 1, wherein the non-polar solvent comprises a fluorine-based solvent.

12. The substrate cleaning method of claim 11, wherein the non-polar solvent comprises at least one solvent selected from the group consisting of HFE, HFC, HFO and PFC.

13. The substrate cleaning method of claim 1, wherein the substrate is a substrate having a film comprising the Ge or III-V group material.

14. The substrate cleaning method of claim 1, wherein the substrate is a substrate having a wiring pattern comprising a metal material.

15. The substrate cleaning method of claim 1, wherein the supplying of the film-forming processing liquid comprises supplying the dissolution processing liquid to a peripheral portion of a back surface of the substrate during the supplying of the film-forming processing liquid to a surface of the substrate or after the supplying of the film-forming processing liquid to the substrate.

16. The substrate cleaning method of claim 1, further comprising:

accommodating, in a carrying container, the substrate on which the processing film is formed after the supplying of the film-forming processing liquid; and taking out the substrate accommodated in the carrying container, wherein the supplying of the peeling processing liquid comprises supplying the peeling processing liquid to the substrate that is taken out from the carrying container.

17. The substrate cleaning method of claim 16, wherein the substrate is a substrate that has a metal wiring formed inside the substrate and at least partially exposed after the dry etching or ashing.

18. The substrate cleaning method of claim 17, wherein the dry etching comprises applying a CF-based gas to the substrate, and the peeling processing liquid is a fluorine-based solvent.

19. A substrate cleaning system for cleaning a substrate comprising Ge or III-V group material, comprising:

a processing liquid supply device configured to supply a film-forming processing liquid comprising a volatile component and a polar organic material, a peeling processing liquid comprising a non-polar solvent and a polar organic solvent in an amount such that the polar organic solvent slightly dissolves the processing film and that the non-polar solvent permeates into the processing film and an interface between the processing film and the substrate and not containing water, a dissolution processing liquid comprising a polar solvent and not containing water, and a rinse processing liquid comprising a polar solvent and not containing water, onto a substrate comprising Ge or III-V group material; and a control device comprising circuitry configured to control the processing liquid supply device, wherein the circuitry of the control device is configured to control the processing liquid supply device such that the film-forming processing liquid that forms a processing film on the substrate is supplied onto the substrate after dry etching or asking, the volatile component is volatilized to solidify or cure the film-forming processing liquid and to form the processing film on the substrate, the peeling processing liquid that peels off the processing film from the substrate is supplied to the processing film formed on the substrate, the dissolution processing liquid that dissolves the processing film is supplied to the processing film after the supplying of the peeling processing liquid, and the rinse processing liquid is supplied to the substrate after the supplying of the dissolution processing liquid to the substrate.

20. A non-transitory computer-readable medium stored thereon a program that when executed by the circuitry of the control device in the substrate cleaning system of claim 19, causes the circuitry of the control device to execute a substrate cleaning method, comprising:

controlling the processing liquid supply device such that the film-forming processing liquid is supplied onto the substrate, the volatile component is volatilized to solidify or cure the film-forming processing liquid and to form the processing film on the substrate, the peeling processing liquid is supplied to the processing film formed on the substrate, and the dissolution processing liquid is supplied to the processing film after the supplying of the peeling processing liquid.

* * * * *